(12) United States Patent
Pan et al.

(10) Patent No.: US 7,951,422 B2
(45) Date of Patent: May 31, 2011

(54) METHODS FOR ORIENTED GROWTH OF NANOWIRES ON PATTERNED SUBSTRATES

(75) Inventors: Yaoling Pan, Union City, CA (US); Xiangfeng Duan, Mountain View, CA (US); Robert S. Dubrow, San Carlos, CA (US); Jay Goldman, Mountain View, CA (US); Shahriar Mostarshed, San Mateo, CA (US); Chunming Niu, Palo Alto, CA (US); Linda T. Romano, Sunnyvale, CA (US); David P. Stumbo, Belmont, CA (US); Alice Fischer-Colbrie, Redwood City, CA (US); Vijendra Sahi, Menlo Park, CA (US); Virginia Robbins, Los Gatos, CA (US)

(73) Assignee: Nanosys, Inc., Palo Alto, CA (US)

( * ) Notice: Subject to any disclaimer, the term of this patent is extended or adjusted under 35 U.S.C. 154(b) by 1023 days.

(21) Appl. No.: 11/641,939

(22) Filed: Dec. 20, 2006

(65) Prior Publication Data
US 2008/0038520 A1 Feb. 14, 2008

Related U.S. Application Data

(60) Provisional application No. 60/754,519, filed on Dec. 29, 2005.

(51) Int. Cl.
*C23C 16/00* (2006.01)
(52) U.S. Cl. ............... 427/248.1; 427/250; 427/252
(58) Field of Classification Search ............ 427/248.1, 427/250, 252
See application file for complete search history.

(56) References Cited

U.S. PATENT DOCUMENTS

| | | | |
|---|---|---|---|
| 5,196,396 | A | 3/1993 | Lieber et al. |
| 5,252,835 | A | 10/1993 | Lieber et al. |
| 5,274,602 | A | 12/1993 | Glen et al. |
| 5,332,910 | A | 7/1994 | Haraguchi et al. |
| 5,338,430 | A | 8/1994 | Parsonage et al. |
| 5,505,928 | A | 4/1996 | Alivisatos et al. |
| 5,512,131 | A | 4/1996 | Kumar et al. |
| 5,640,343 | A | 6/1997 | Gallagher et al. |

(Continued)

FOREIGN PATENT DOCUMENTS

WO WO-03085701 10/2003

(Continued)

OTHER PUBLICATIONS

Wang, D. et al. "Deterministic one-to-one synthesis of germanium nanowires and individual gold nanoseed patterning for alinged nanowre arrays" Angew. Chem. Int. Ed. (2005) 44(19:2925-2929.

(Continued)

*Primary Examiner* — Timothy H Meeks
*Assistant Examiner* — Kelly M Gambetta
(74) *Attorney, Agent, or Firm* — Donna M. Fabian

(57) ABSTRACT

The present invention is directed to systems and methods for nanowire growth and harvesting. In an embodiment, methods for nanowire growth and doping are provided, including methods for epitaxial oriented nanowire growth using a combination of silicon precursors, as well as us of patterned substrates to grow oriented nanowires. In a further aspect of the invention, methods to improve nanowire quality through the use of sacrifical growth layers are provided. In another aspect of the invention, methods for transferring nanowires from one substrate to another substrate are provided.

37 Claims, 25 Drawing Sheets

U.S. PATENT DOCUMENTS

| | | | |
|---|---|---|---|
| 5,674,592 A | 10/1997 | Clark et al. |
| 5,690,807 A | 11/1997 | Clark, Jr. et al. |
| 5,751,018 A | 5/1998 | Alivisatos et al. |
| 5,840,435 A | 11/1998 | Lieber et al. |
| 5,858,862 A | 1/1999 | Westwater et al. |
| 5,897,945 A | 4/1999 | Lieber et al. |
| 5,953,595 A | 9/1999 | Gosain et al. |
| 5,962,863 A | 10/1999 | Russell et al. |
| 5,976,957 A | 11/1999 | Westwater et al. |
| 5,990,479 A | 11/1999 | Weiss et al. |
| 5,997,832 A | 12/1999 | Lieber et al. |
| 6,004,444 A | 12/1999 | Aksay et al. |
| 6,036,774 A | 3/2000 | Lieber et al. |
| 6,048,616 A | 4/2000 | Gallagher et al. |
| 6,128,214 A | 10/2000 | Kuekes et al. |
| 6,130,142 A | 10/2000 | Westwater et al. |
| 6,130,143 A | 10/2000 | Westwater et al. |
| 6,136,156 A | 10/2000 | El-Shall et al. |
| 6,159,742 A | 12/2000 | Lieber et al. |
| 6,190,634 B1 | 2/2001 | Lieber et al. |
| 6,207,229 B1 | 3/2001 | Bawendi et al. |
| 6,225,198 B1 | 5/2001 | Alivisatos et al. |
| 6,235,675 B1 | 5/2001 | McIlroy |
| 6,248,674 B1 | 6/2001 | Kamins et al. |
| 6,256,767 B1 | 7/2001 | Kuekes et al. |
| 6,274,007 B1 | 8/2001 | Smirnov et al. |
| 6,306,734 B1 * | 10/2001 | Givargizov | 438/478 |
| 6,306,736 B1 | 10/2001 | Alivisatos et al. |
| 6,310,189 B1 | 10/2001 | Fodor et al. |
| 6,322,901 B1 | 11/2001 | Bawendi et al. |
| 6,329,214 B1 | 12/2001 | Hattori et al. |
| 6,339,281 B2 | 1/2002 | Lee et al. |
| 6,380,103 B2 | 4/2002 | Gonzalez et al. |
| 6,383,923 B1 | 5/2002 | Brown et al. |
| 6,413,489 B1 | 7/2002 | Ying et al. |
| 6,438,025 B1 | 8/2002 | Skarupo |
| 6,447,663 B1 | 9/2002 | Lee et al. |
| 6,465,132 B1 | 10/2002 | Jin |
| 6,471,761 B2 | 10/2002 | Fan et al. |
| 6,536,106 B1 | 3/2003 | Jackson et al. |
| 6,566,704 B2 | 5/2003 | Choi et al. |
| 6,586,785 B2 | 7/2003 | Flagan et al. |
| 6,741,019 B1 | 5/2004 | Filas et al. |
| 6,760,245 B2 | 7/2004 | Eaton et al. |
| 6,773,616 B1 | 8/2004 | Chen et al. |
| 6,781,166 B2 | 8/2004 | Lieber et al. |
| 6,798,000 B2 | 9/2004 | Luyken et al. |
| 6,815,218 B1 | 11/2004 | Jacobson et al. |
| 6,815,750 B1 | 11/2004 | Kamins |
| 6,831,017 B1 | 12/2004 | Li et al. |
| 6,858,455 B2 | 2/2005 | Guillom et al. |
| 6,872,645 B2 | 3/2005 | Duan et al. |
| 6,878,871 B2 | 4/2005 | Scher et al. |
| 6,879,143 B2 | 4/2005 | Nagahara et al. |
| 6,882,051 B2 | 4/2005 | Majumdar et al. |
| 6,962,823 B2 | 11/2005 | Empedocles et al. |
| 7,051,945 B2 | 5/2006 | Empedocles et al. |
| 7,067,328 B2 | 6/2006 | Dubrow et al. |
| 7,067,867 B2 | 6/2006 | Duan et al. |
| 7,091,120 B2 | 8/2006 | Buretea et al. |
| 7,105,428 B2 | 9/2006 | Pan et al. |
| 7,129,554 B2 | 10/2006 | Lieber et al. |
| 7,211,464 B2 | 5/2007 | Lieber et al. |
| 7,649,192 B2 | 1/2010 | Choi et al. |
| 2001/0023986 A1 | 9/2001 | Mancevski |
| 2002/0014667 A1 | 2/2002 | Shin et al. |
| 2002/0117659 A1 | 8/2002 | Lieber et al. |
| 2002/0125192 A1 | 9/2002 | Lopez et al. |
| 2002/0127495 A1 | 9/2002 | Scherer |
| 2002/0130311 A1 | 9/2002 | Lieber et al. |
| 2002/0130353 A1 | 9/2002 | Lieber et al. |
| 2002/0158342 A1 | 10/2002 | Tuominen et al. |
| 2002/0163079 A1 | 11/2002 | Awano |
| 2002/0175408 A1 * | 11/2002 | Majumdar et al. | 257/734 |
| 2003/0012723 A1 | 1/2003 | Clarke |
| 2003/0042562 A1 | 3/2003 | Giebeler et al. |
| 2003/0044777 A1 | 3/2003 | Beattie |
| 2003/0071246 A1 | 4/2003 | Grigorov |
| 2003/0089899 A1 | 5/2003 | Lieber et al. |
| 2003/0121887 A1 | 7/2003 | Garvey et al. |
| 2003/0186522 A1 | 10/2003 | Duan et al. |
| 2003/0189202 A1 | 10/2003 | Li et al. |
| 2004/0005258 A1 | 1/2004 | Fonash et al. |
| 2004/0026684 A1 | 2/2004 | Empedocles et al. |
| 2004/0031975 A1 | 2/2004 | Kern et al. |
| 2004/0036126 A1 | 2/2004 | Chau et al. |
| 2004/0036128 A1 | 2/2004 | Zhang et al. |
| 2004/0061422 A1 | 4/2004 | Avouris et al. |
| 2004/0095658 A1 | 5/2004 | Buretea et al. |
| 2004/0112964 A1 | 6/2004 | Empedocles et al. |
| 2004/0135951 A1 | 7/2004 | Stumbo et al. |
| 2004/0146560 A1 | 7/2004 | Whiteford et al. |
| 2004/0147098 A1 | 7/2004 | Mazan et al. |
| 2005/0011431 A1 | 1/2005 | Samuelson et al. |
| 2005/0064618 A1 | 3/2005 | Brown et al. |
| 2005/0066883 A1 | 3/2005 | Dubrow et al. |
| 2005/0079659 A1 | 4/2005 | Duan et al. |
| 2005/0089467 A1 | 4/2005 | Grill et al. |
| 2005/0145596 A1 | 7/2005 | Metz et al. |
| 2005/0176228 A1 | 8/2005 | Fonash et al. |
| 2005/0191774 A1 | 9/2005 | Li et al. |
| 2005/0266662 A1 | 12/2005 | Yi |
| 2005/0279274 A1 | 12/2005 | Niu et al. |
| 2006/0008942 A1 | 1/2006 | Romano et al. |
| 2006/0009003 A1 | 1/2006 | Romano et al. |
| 2006/0019470 A1 | 1/2006 | Seifert et al. |
| 2006/0057360 A1 | 3/2006 | Samuelson et al. |
| 2006/0255481 A1 | 11/2006 | Pan et al. |
| 2007/0004225 A1 * | 1/2007 | Lu et al. | 438/778 |
| 2008/0093698 A1 | 4/2008 | Tsakalakos et al. |
| 2009/0203282 A1 | 8/2009 | Tseng et al. |

FOREIGN PATENT DOCUMENTS

| | | |
|---|---|---|
| WO | WO-2005023923 | 3/2005 |

OTHER PUBLICATIONS

Supplemental European Search Report issued Aug. 4, 2009 in corresponding European Patent Application No. 06851310.0.

Bachtold, A. et al., "Logic Circuits with Carbon Nanotube Transistors" *Science* (2001) 294:1317-1320.

Bjork, M.T. et al. "One-dimensional Steeplechase for Electron Realized" Nano Lett (2002) 2:86-90.

Cao, Y.W. et al. "Growth and Properties of Semiconductor Core/Shell Nanocrystals with InAs Cores" J. Am. Chem. Soc. (2000) 122:9692-9702.

Chen, J. et al., "Observation of a Large On-Off Ratio and Negative Differential Resistance in an Electronic Molecular Switch" *Science* (1999) 286:1550-1552.

Chung, S-W. et al., "Silicon Nanowire Devices" *App. Phys. Letts.* (2000) 76(15):2068-2070.

Collier, C.P. et al., "Electronically Configurable Molecular-Based Logic Gates" *Science* (1999) 285:391-394.

Cui, Y. et al. "Doping and electrical transport in silicon wires" J. Phys. Chem. B. (2000) 104:5213-5216.

Cui, Y. et al. "Diameter-controlled synthesis of single-crystal silicon nanowires" Appl. Phys. Lett (2001) 78(15):2214-2216.

Cui, Y. et al., "Functional Nanoscale electronic devices assembled using silicon nanowire building blocks" *Science* (2001) 291:851-853.

Dabbousi, B.O. et al., "(CdSe)ZnS core-shell quantum dots: Synthesis and characterization of a size series of highly luminescent nanocrystallites" J. Phys. Chem. B (1997) 101:9463-9475.

Derycke, V. et al., "Carbon Nanotube Inter-and Intramolecular Logic Gates" *Nano Letters* (2001) 1(9):453-456.

Duan, X. et al. "General synthesis of compound semiconductor nanowires" Adv. Mat. (2000) 12:298-302.

Duan, X. et al. "High-performance thin-film transistors using semiconductor nanowires and nanoribbons" Nature (2003) 425:274-278.

Givargizov, E.I. "Fundamental Aspects of VLS Growth" *J. Cryst. Growth* (1975) 31:20-30.

Greene, L.E. et al. "Low-temperature wafer-scale production of ZnO Nanowire Arrays" Angew. Chem. (2003) 42:3031-3034.

Gudicksen, M.S. et al. "Diameter-selective synthesis of semiconductor nanowires" J. Am. Chem. Soc. (2000) 122:8801-8802.

Gudicksen, M.S. et al. "Synthetic control of the diameter and length of single crystal semiconductor nanowires" J. Phys. Chem. B (2001) 105:4062-4064.

Gudicksen, M.S. et al. "Growth of nanowire superlattice structures of nanoscale photonics and electronics" Nature (2002) 415:617-620.

Hamers, R.J. et al. "Electrically directed assembly and detection of nanowire bridges in aqueous media" Nanotech (2006) 17:S280-S286.

Haraguchi, K. et al., "Polarization Dependence of Ligh Emitted from GaAs p-n junctions in quantum wire crystals" *J. Appl. Phys.* (1994) 75(8):4220-4225.

Haraguchi, K. et al., "Self Organized Fabrication of Planar GaAs Nanowhisker Arrays" *Appl. Phys. Lett.* (1996) 69(3):386-387.

Hiruma, K. et al., "GaAs Free Standing Quantum Sized Wires" *J. Appl. Phys.* (1993) 74(5):3162-3171.

Hofmann, S. et al., "Gold Catalyzed Growth of Silicon Nanowires by Plasma Enhanced Chemical Vapor Deposition," *J. Appl. Phys.* 94:6005-6012 (2003).

Huang, Y. et al., "Directed Assembly of One-Dimensional Nanostructures into Functional networks" *Science* (2001) 291:630-633.

Huang, Y. et al., "Logic Gates and Computation from Assembled Nanowire Building Blocks" *Science* (2001) 294:1313-1317.

Jun, Y-W, et al. "Controlled synthesis of multi-armed CdS nanorod architectures using monosurfactant system" J. Am. Chem. Soc. (2001) 123:5150-5151.

Kong, J. et al., "Synthesis of individual single-walled carbon nanotubes on patterned silicon wafers" *Nature* (1998) 395:878-881.

Kong, J. et al., "Chemical vapor deposition of methane for single-walled carbon nanotubes" *Chem. Phys. Lett.*(1998) 292:567-574.

Kong, J. et al., "Nanotube molecular wires as chemical sensors" *Science* (2000) 287:622-625.

Liu, C. et al. "Sol-Gel Synthesis of Free-Standing Ferroelectric Lead Zirconate Titanate Nanoparticles" J. Am. Chem. Soc. (2001) 123:4344-4345.

Manalis, S.F. et al., "Microvolume field-effect pH sensor for the scanning probe microscope" *Applied Phys. Lett.* (2000) 76:1072-1074.

Manna, L. et al. "Synthesis of soluble and processable rod-, arrow-, teardrop-, and tetrapod-shaped CdSe nanocrystals" J. Am. Chem. Soc. (2000) 122:12700-12706.

Manna, L. et al. "Epitaxial growth and photochemical annealing of graded Cds/ZnS shells on colloidal CdSe nanorods" J. Am. Chem. Soc. (2002) 124:7136-7145.

Morales, A.M. et al. "A laser ablation method for the synthesis of crystalling semiconductor nanowires" Science (1998) 279:208-211.

Peng, X. et al. "Epitaxial growth of highly luminescent CdSe/CdS core/shell nanocrystals with photostability and electronic accessibility" J. Am. Chem. Soc. (1997) 119:7019-7029.

Peng, X. et al. "Shape control of CdSe nanocrystals" Nature (2000) 404:59-61.

Puntes, V.F. et al. "Colloidal nanocrystal shape and size control: The case of cobalt " Science (2001) 291:2115-2117.

Schon J.H. et al., "Field-effect modulation of the conductance of single molecules" *Science* (2001) 294:2138-2140.

Schon, J.H. et al., "Self-assembled monolayer organic field-effect transistors" (2001) *Nature* 413:713-716.

Service, R.F., "Assembling nanocircuits from the bottom up" *Science* (2001) 293:782-785.

Smith, P.A. et al. "Electric-field assisted assembly and alignment of metal nanowires" Appl Phys. Lett (2000) 77(9):1399-1400.

Swihart, M.T. et al. "On the mechanism of homogeneous decomposition of the chlorinated silanes. Chain reactions propogated by divalent silicon species" J. Phys. Chem. A (1998) 102:1542-1549.

Tang, et al., "Synthesis of InN Nanowires Using a Two-Zone Chemical Vapor Deposition Approach" IEEE (Aug. 14, 2003) 205-207.

Tans, S.J. et al., "Room-temperature transistor based on a single carbon nanotube" *Nature* (1998) 393:49-52.

Thess, A. et al., "Crystalline ropes of metallic carbon nanotubes" (1996) *Science* 273:483-486.

Tseng, G.Y. et al., "Toward nanocomputers" (2001) *Science* 294:1293-1294.

Urban, J.J. et al. "Synthesis of single-crystalline perovskite nanowires composed of brium titanate and strontium titanate" J. Am. Chem. Soc. (2002) 124:1186-1187.

Wagner, R.S. et al., "Vapor-Liquid-Solid mechanism of single crystal growth" *Appl. Phys. Lett.* (1964) 4(5):89-90.

Wang et al., "Low Temperature Synthesis of Single-Crystal Germanium Nanowires by Chemical Vapor Deposition" *Angew. Chem. Int. Ed.* (2002) 41(24):4783-4786.

Wu, Y. et al. "Block-by-block growth of single-crystalline Si/SiGe superlattice nanowires" Nano Lett (2002) 2:83-86.

Yamada, T. "Analysis of submicron carbon nanotube field-effect transistors" *Appl. Phys Letts* (2000) 76(5):628-630.

Yamamoto, K. et al. "Orientation and purification of carbon nanotubes using ac electrophoresis" *J. Phys D: Appl. Phys* (1998) 8:L34-L36.

Yazawa, M. et al. "Semiconductor nanowhiskers" *Adv. Mater.*(1993) 5(7/8):577-580.

Yun, W.S. et al. "Ferroelectric properties of individual barium titanate nanowires investigated by scanned probe microscopy" Nano Lett (2002) 2(5):447-450.

Zhou, C. et al., "Nanoscale metal/shelf-assembled monolayer/metal heterostructures" *Applied Phys. Lett* (1997) 71:611-613.

\* cited by examiner

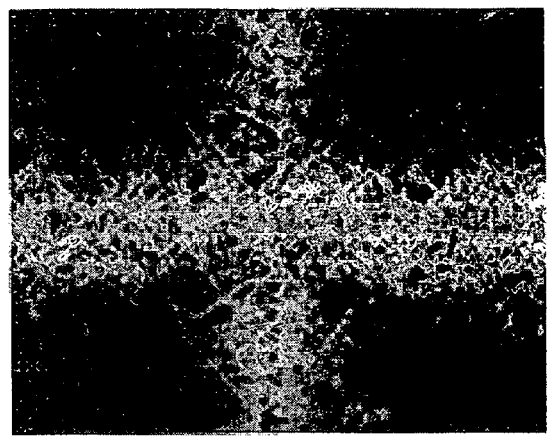
A
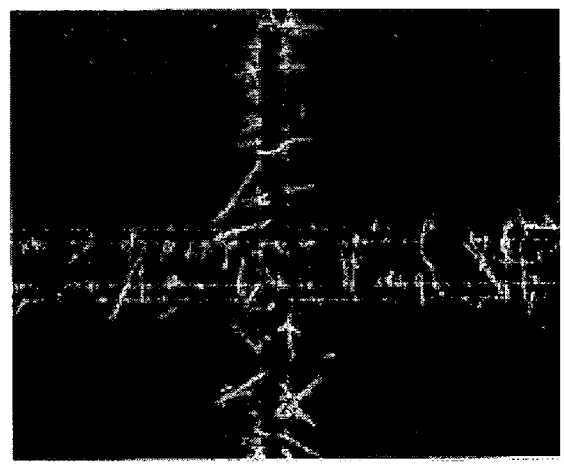
B
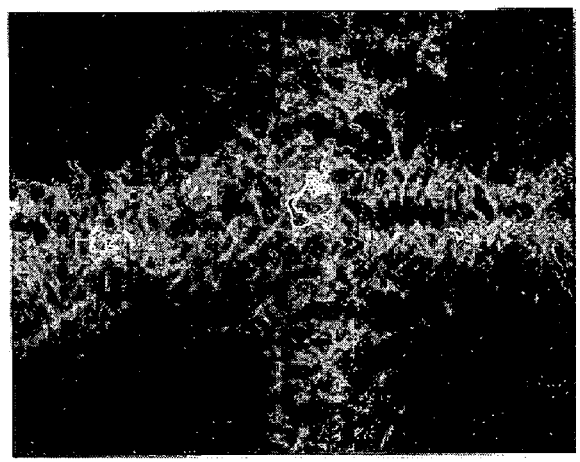
C
FIG. 23 A-C

METHODS FOR ORIENTED GROWTH OF NANOWIRES ON PATTERNED SUBSTRATES

CROSS REFERENCE TO RELATED APPLICATIONS

This application claims the benefit of U.S. Provisional Patent Application No. 60/754,519, filed Dec. 29, 2005, the disclosure of which is incorporated herein by reference in its entirety.

BACKGROUND OF THE INVENTION

1. Field of the Invention

The present invention relates to nanowires, and more particularly, to nanowire growth and harvesting.

2. Background of the Invention

Nanostructures, and in particular, nanowires have the potential to facilitate a whole new generation of electronic devices. A major impediment to the emergence of this new generation of electronic devices based on nanostructures is the ability to effectively grow and harvest nanowires and other nanostructures that have consistent characteristics. Current approaches to grow and harvest nanowires do not facilitate mass production and do not yield consistent nanowire performance characteristics.

What are needed are systems and methods to grow and harvest nanowires that have consistent performance characteristics.

SUMMARY OF THE INVENTION

The present invention provides methods for producing nanowires that include depositing one or more nucleating particles on a substrate material; heating the nucleating particles to a first temperature, contacting the nucleating particles with a first precursor gas mixture to create a liquid alloy droplet and initiate nanowire growth, heating the alloy droplet to a second temperature, and contacting the alloy droplet with a second precursor gas mixture, whereby nanowires are grown at the site of the alloy droplet. The substrate material utilized in the processes of the present invention may be crystallographic or amorphous. Suitably, the substrate material comprises crystallographic silicon, either polycrystalline or single crystalline. In other embodiments, the substrate may be amorphous $SiO_2$, $Si_3N_4$, or alumina.

In another embodiment, the present invention provides methods for producing nanowires (e.g., Si nanowires) which include depositing one or more nucleating particles (e.g., a metal catalyst such as gold nanoparticles) on a substrate material (or nucleating nanoparticles on a substrate surface (e.g., by heating a gold film coating layer on the surface)), heating the nucleating particles to a first temperature at which a first precursor gas decomposes to form a eutectic phase with the nucleating particles, contacting the nucleating particles with the first precursor gas mixture, wherein the first precursor gas mixture comprises a first precursor gas comprising at least one atomic species (e.g., Cl) that assists in orienting the growing nanowires (e.g., by etching as described in more detail below), contacting nucleating particles with a second precursor gas mixture after initiation of nanowire growth, wherein the second precursor gas mixture includes a precursor gas that decomposes to form a eutectic phase with the nucleating particles at a second temperature which is lower than the first temperature, and heating the nucleating particles to the second temperature.

The above method can be reversed such that the process of nanowire growth is initiated with a precursor gas at the lower temperature, and then nanowire growth is continued at a higher temperature using a second precursor gas (e.g., a gas having a reactive etchant species to aid in nanowire orientation such as chlorine). The first precursor gas utilized is preferably $SiCl_4$ or $SiH_2Cl_2$ which contains Si and Cl atoms upon disassociation at the first temperature. The Si atoms provide for nanowire growth and the Cl atoms allow for growth of the wires in a <111> orientation when grown on a crystallographic substrate as a result of etching of the native oxide layer on the silicon substrate. Once nanowire growth has been initiated, a second precursor gas mixture including a precursor gas such as $SiH_4$ or $Si_2H_6$ can be introduced which decomposes to form a eutectic phase with the nucleating particles at a lower temperature than the first precursor gas. The disassociated Si atoms from $SiH_4$ or $Si_2H_6$ at the second temperature continue the growth of the Si nanowires. Thus, nanowire growth can continue with the free Si atoms at a lower temperature than that at which nanowire growth is initiated, e.g., allowing growth of the oriented wires to a desired length while minimizing diffusion of the metal catalyst into the growing nanowires.

The substrate material utilized in these methods may be crystallographic or amorphous. Suitably, the substrate material comprises crystallographic silicon, either polycrystalline or single crystalline. In other embodiments, the substrate may be amorphous $SiO_2$, $Si_3N_4$, or alumina.

In embodiments where crystalline substrates are utilized, the wires growing on the substrate material can preferably grow in an epitaxial orientation. Nanowires produced according to the processes of the present invention grow out of the plane of the substrate material, and are capable of transporting electrical charge.

In certain suitable embodiments of the methods of the present invention, the first temperature to which the nucleating particles is heated is higher than the second temperature to which the alloy droplet is heated. Suitably, the first temperature is at least about 50° C. higher than the second temperature. The nucleating particles used in the practice of the present invention will suitably be a metal catalyst and will comprise a metal that reacts with both the first precursor gas mixture and the second precursor gas mixture (i.e., decomposed first and second precursor gas mixtures) to form a eutectic from which Si may precipitate. Suitable metal catalysts comprise Au, Al, Pt, Fe, Ti, Ga, Ni, Sn or In and in certain such embodiments, may be a Au or Al colloid or Au or Al film.

The first precursor gas mixture and the second precursor gas mixture utilized in the processes of the present invention will suitably comprise $SiH_4$, $Si_2H_6$, $SiCl_4$ or $SiH_2Cl_2$, and may further comprise $B_2H_6$, trimethyl boron (TMB) $POCl_3$ or $PH_3$ (e.g., as dopant materials). Additional embodiments of the processes of the present invention may further comprise contacting the growing nanowires with one or more additional precursor gas mixtures comprising $SiH_4$, $Si_2H_6$, $SiCl_4$ or $SiH_2Cl_2$ and further comprising $B_2H_6$, TMB, $POCl_3$ or $PH_3$ to grow the nanowires to a desired length. The precursor gases used in the processes of the present invention may also suitably be introduced via plasma enhanced sputter deposition.

In another embodiment of the present invention, the need for growing nanowires at different temperatures can be avoided by growing the nanowires at lower temperatures (e.g., lower than about 800° C.) using Plasma Enhanced Sputter Deposition (or Plasma Enhanced Chemical Vapor Deposition (PECVD)). In this embodiment, the nucleating particles are contacted with a precursor gas mixture that preferably includes a precursor gas comprising a reactive species (e.g., Cl) that aids in orienting the growing nanowires, such as $SiCl_4$ or $SiH_2Cl_2$. Alternatively, the precursor gas mixture may include chlorine gas (or plasma) from a separate, independent source that can be provided in combination with one or more of the precursor gases discussed above (e.g., $SiH_4$, $Si_2H_6$, $SiCl_4$ or $SiH_2Cl_2$). Where the precursor gas mixture includes $SiCl_4$ or $SiH_2Cl_2$, decomposition of $SiCl_4$ or $SiH_2Cl_2$ into Si and Cl in the presence of a carrier gas (e.g., $H_2$, $H_2Ar$) forms HCl. As discussed in more detail below, this creates a competition between etching with HCl and growth from the Si vapor. Chlorine aids in removal of interfacial oxide on Si substrates leading to the oriented nanowire growth. The addition of an independent source of chlorine gas has the advantage of allowing the reactive species of Si and Cl to be independently controlled in the plasma to enhance or suppress etching as needed to promote nanowire growth. Sputter deposition can be accomplished via any method known to the ordinarily skilled artisan, for example, diode, radio frequency and direct current deposition.

The present invention also provides methods for producing nanowires which do not involve metal catalysts, including, for example, hydroxylating a substrate material, contacting the substrate material with a first precursor gas mixture, forming one or more nuclei (e.g., nanoparticles) on a surface of the substrate material, contacting the nuclei with a second precursor gas mixture, and growing nanowires at the site of the one or more nuclei.

In another aspect of the invention, additional methods for nanowire synthesis are provided. In an embodiment, a method for nanowire synthesis includes positioning a granular precursor material at one end of a vessel at one temperature and positioning catalyst particles at an opposite end of the vessel at another temperature. Materials are then transferred from one end of the vessel to another. A transport agent is reacted with the granular nanowire precursor material to form nanowires. In an alternative embodiment, a similar method is provided to dope nanowires.

In a further aspect of the invention, methods to improve nanowire quality during manufacturing are provided. In particular, a method to reduce surface states from dangling bonds on a nanowire structure is provided. In an embodiment, the method includes creating a nanowire structure, depositing a sacrificial layer on the nanowire structure, passivating the nanowire structure with the sacrificial layer, and chemically removing the sacrificial layer to free the nanowires.

In another embodiment, a method for producing a nanowire device is disclosed that includes providing a substrate having nanowires attached to a surface in a vertical orientation, depositing a dielectric layer on the surface of the nanowires, depositing one or more nanowire contacts on the nanowires, depositing a material over the nanowires to form a nanowire composite, and separating the nanowire composite from the substrate.

A series of methods are also provided for harvesting nanowires. In an embodiment, a method includes growing a nanowire with a desired portion and a sacrificial portion. The desired portion has different properties than those of the sacrificial portion. In one example, the sacrificial portion is an alloy and the desired portion is not. In another example, the sacrificial portion is doped differently than the desired portion. Wet etchants are used to differentially remove the sacrificial portion of the nanowires. The example wet etchants etch away the sacrificial portion of the nanowire at a far greater rate than the desired portion. As a result, nanowires can be produced with consistent lengths.

In another embodiment, silicon nanowires are grown on a silicon substrate in which the orientation of the silicon in the nanowires is different from the orientation of the silicon in the substrate. For example, the atoms in the silicon nanowires can have Miller indices of 111, while the silicon atoms in the substrate can have Miller indices of 100. As in the previous case, wet etchants can be used to differentially remove portions of the silicon substrate to free the nanowires.

In another aspect of the invention, methods for transferring nanowires from one substrate to another substrate are provided. The methods can be used, for example, to transfer nanowires from a nanowire growth substrate to a device substrate. In an embodiment, the method includes coating a transfer surface with a non-stick coating, such as TEFLON. The transfer surface can then be pressed against nanowires that are affixed to a nanowire growth substrate. The nanowires become stuck to the transfer surface with the non-stick coating. The transfer surface is then positioned over a device substrate, and pressure is applied to the back of the transfer surface to release the nanowires onto the device substrate. In alternative embodiments, the transfer surface can be patterned with a non-stick coating to match areas on a device substrate where nanowires are to be placed. In a similar alternative embodiment, the non-stick coating can be distributed all over the transfer surface, and pressure can be placed on the backside of the transfer surface in a patterned fashion to release nanowires onto particular areas of a device substrate.

In an additional embodiment, a methods for harvesting and transferring nanowires are disclosed that include providing a substrate material having one or more nanowires attached to a top surface, providing a transfer substrate oriented above the top surface of the substrate, applying pressure to the transfer substrate, such that the transfer substrate is brought in contact with the one or more nanowires, transferring one or more of the nanowires from the substrate to the transfer substrate, and removing the transfer substrate. In this embodiment, the transfer substrate can be a flexible polymer and a probe can be used to apply pressure. In embodiments the probe may be heated or the substrate may be heated.

In a further embodiment, the present invention provides methods for producing nanowires, comprising: layering a catalyst-repelling material on a substrate material to at least partially cover the substrate material; depositing one or more nucleating particles on the substrate material; heating the nucleating particles to a first temperature; contacting the nucleating particles with a first precursor gas mixture to create a liquid alloy droplet to initiate nanowire growth; heating the alloy droplet to a second temperature; and contacting the alloy droplet with a second precursor gas mixture, whereby nanowires are grown at the site of the alloy droplet. Suitably, the substrate material will comprise a crystallographic material, such as Si, and the nucleating particles will comprise metallic films or colloids, such as films or colloids comprising Au, Al, Pt, Fe, Ti, Ga, Ni, Sn or In. Examples of catalyst-repelling material include, but are not limited to, $SiO_2$, and anodic alumina. As noted throughout, the temperature and precursor gases can be varied throughout the growth process, suitably starting at a higher temperature initially, and then using a lower temperature for continued nanowire growth. Examples of precursor gas mixtures for use in the methods of the present invention include, but are not limited to, $SiH_4$, $SiCl_4$ and $SiH_2Cl_2$. The present invention also provides nanowires produced by the methods of the present invention and electronic devices comprising such nanowires.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

FIG. 23A is a transmission electron micrograph that shows a substrate with e-field oriented nanowires prior to transfer, according to an embodiment of the invention.

FIG. 23B is a transmission electron micrograph that shows nanowires remaining on substrate following transfer, according to an embodiment of the invention.

FIG. 23C is a transmission electron micrograph that shows nanowires on transfer substrate following transfer, according to an embodiment of the invention.

DETAILED DESCRIPTION OF THE INVENTION

Figure 1A:
FIG. 1A is a diagram of a single crystal semiconductor nanowire.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires.

It should be appreciated that although nanowires are frequently referred to, the techniques described herein are also applicable to other nanostructures, such as nanorods, nanotubes, nanotetrapods, nanoribbons and/or combinations thereof. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, an "aspect ratio" is the length of a first axis of a nanostructure divided by the average of the lengths of the second and third axes of the nanostructure, where the second and third axes are the two axes whose lengths are most nearly equal to each other. For example, the aspect ratio for a perfect rod would be the length of its long axis divided by the diameter of a cross-section perpendicular to (normal to) the long axis.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanocrystal, or the center of a nanocrystal, for example. A shell need not completely cover the adjacent materials to be considered a shell or for the nanostructure to be considered a heterostructure. For example, a nanocrystal characterized by a core of one material covered with small islands of a second material is a heterostructure. In other embodiments, the different material types are distributed at different locations within the nanostructure. For example, material types can be distributed along the major (long) axis of a nanowire or along a long axis of arm of a branched nanocrystal. Different regions within a heterostructure can comprise entirely different materials, or the different regions can comprise a base material.

As used herein, a "nanostructure" is a structure having at least one region or characteristic dimension with a dimension of less than about 500 mm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g., heterostructures). Nanostructures can be, for example, substantially crystalline, substantially monocrystalline, polycrystalline, amorphous, or a combination thereof. In one aspect, each of the three dimensions of the nanostructure has a dimension of less than about 500 nm, for example, less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100.

The nanowires of this invention can be substantially homogeneous in material properties, or in certain embodiments can be heterogeneous (e.g. nanowire heterostructures). The nanowires can be fabricated from essentially any convenient material or materials, and can be, e.g., substantially crystalline, substantially monocrystalline, polycrystalline, or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions, which are incorporated herein by reference.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

A wide range of types of materials for nanowires, nanorods, nanotubes and nanoribbons can be used, including semiconductor material selected from, e.g., Si, Ge, Sn, Se, Te, B, C (including diamond), P, B—C, B—P($BP_6$), B—Si, Si—C, Si—Ge, Si—Sn and Ge—Sn, SiC, BN/BP/BAs, AlN, AlP, AlAs, AlSb, GaN, GaP, GaAs, GaSb, InN, InP, InAs, InSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, $Te)_2$, $Si_3N_4$, $Ge_3N_4$, $Al_2O_3$, (Al, Ga, $In)_2$ (S, Se, $Te)_3$, $Al_2CO$, and an appropriate combination of two or more such semiconductors.

The nanowires can also be formed from other materials such as metals such as gold, nickel, palladium, iridium, cobalt, chromium, aluminum, titanium, tin and the like, metal alloys, polymers, conductive polymers, ceramics, and/or combinations thereof. Other now known or later developed conducting or semiconductor materials can be employed.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te. Other now known or later developed dopant materials can be employed.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

It should be understood that the spatial descriptions (e.g., "above", "below", "up", "down", "top", "bottom," etc.) made herein are for purposes of illustration only, and that devices of the present invention can be spatially arranged in any orientation or manner. In addition, there may also be intervening layers for materials present in such devices to facilitate processing.

Types of Nanowires and Their Synthesis

FIG. 1A illustrates a single crystal semiconductor nanowire core (hereafter "nanowire") 100. FIG. 1A shows a nanowire 100 that is a uniformly doped single crystal nanowire. Such single crystal nanowires can be doped into either p- or n-type semiconductors in a fairly controlled way. Doped nanowires such as nanowire 100 exhibit improved electronic properties. For instance, such nanowires can be doped to have carrier mobility levels comparable to bulk single crystal materials.

Figure 1B:
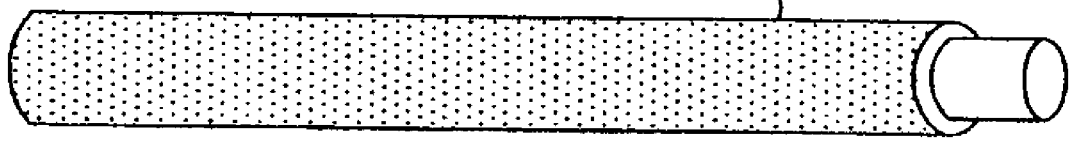
FIG. 1B is a diagram of a nanowire doped according to a core-shell structure.

FIG. 1B shows a nanowire 110 doped according to a core-shell structure. As shown in FIG. 1B, nanowire 110 has a doped surface layer 112, which can have varying thickness levels, including being only a molecular monolayer on the surface of nanowire 110.

The valence band of the insulating shell can be lower than the valence band of the core for p-type doped wires, or the conduction band of the shell can be higher than the core for n-type doped wires. Generally, the core nanostructure can be made from any metallic or semiconductor material, and the shell can be made from the same or a different material. For example, the first core material can comprise a first semiconductor selected from the group consisting of: a Group II-VI semiconductor, a Group III-V semiconductor, a Group IV semiconductor, and an alloy thereof. Similarly, the second material of the shell can comprise a second semiconductor, the same as or different from the first semiconductor, e.g., selected from the group consisting of: a Group II-VI semiconductor, a Group III-V semiconductor, a Group IV semiconductor, and an alloy thereof. Example semiconductors include, but are not limited to, CdSe, CdTe, InP, InAs, CdS, ZnS, ZnSe, ZnTe, HgTe, GaN, GaP, GaAs, GaSb, InSb, Si, Ge, AlAs, AlSb, PbSe, PbS, and PbTe. As noted above, metallic materials such as gold, chromium, tin, nickel, aluminum etc. and alloys thereof can be used as the core material, and the metallic core can be overcoated with an appropriate shell material such as silicon dioxide or other insulating materials.

Nanostructures can be fabricated and their size can be controlled by any of a number of convenient methods that can be adapted to different materials. For example, synthesis of nanocrystals of various composition is described in, e.g., Peng et al. (2000) "Shape Control of CdSe Nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" J. Am. Chem. Soc. 122, 8801-8802; Cui et al. (2001) "Diameter-controlled synthesis of single-crystal silicon nanowires" Appl. Phys. Lett. 78, 2214-2216; Gudiksen et al. (2001) "Synthetic control of the diameter and length of single crystal semiconductor nanowires" J. Phys. Chem. B 105, 4062-4064; Morales et al. (1998) "A laser ablation method for the synthesis of crystalline semiconductor nanowires" Science 279, 208-211; Duan et al. (2000) "General synthesis of compound semiconductor nanowires" Adv. Mater. 12, 298-302; Cui et al. (2000) "Doping and electrical transport in silicon nanowires" J. Phys. Chem. B 104, 5213-5216; Peng et al. (2000) "Shape control of CdSe nanocrystals" Nature 404, 59-61; Puntes et al. (2001) "Colloidal nanocrystal shape and size control: The case of cobalt" Science 291, 2115-2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" J. Am. Chem. Soc., 124, 1186; and Yun et al. (2002) "Ferroelectric Properties of Individual Barium Titanate Nanowires Investigated by Scanned Probe Microscopy" Nanoletters 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" J. Am. Chem. Soc. 123, 5150-5151; and Manna et al. (2000) "Synthesis of Soluble and Processable Rod-, Arrow-, Teardrop-, and Tetrapod-Shaped CdSe Nanocrystals" J. Am. Chem. Soc. 122, 12700-12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" J. Am. Chem. Soc. 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" J. Am. Chem. Soc. 119, 7019-7029; Dabbousi et al. (1997) "(CdSe)ZnS core-shell quantum dots: Synthesis and characterization of a size series of highly luminescent nanocrysallites" J. Phys. Chem. B 101, 9463-9475; Manna et al. (2002) "Epitaxial growth and photochemical annealing of graded CdS/ZnS shells on colloidal CdSe nanorods" J. Am. Chem. Soc. 124, 7136-7145; and Cao et al. (2000) "Growth and properties of semiconductor core/shell nanocrystals with InAs cores" J. Am. Chem. Soc. 122, 9692-9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617-620; Bjork et al. (2002) "One-dimensional steeplechase for electrons realized" *Nano Letters* 2, 86-90; Wu et al. (2002) "Block-by-block growth of single-crystalline Si/SiGe superlattice nanowires" *Nano Letters* 2, 83-86; and U.S. patent application 60/370,095 (Apr. 2, 2002) to Empedocles entitled "Nanowire heterostructures for encoding information." Similar approaches can be applied to growth of other heterostructures.

Epitaxial-Oriented Nanowire Growth Using a Combination of Silicon Precursors

Figure 2:
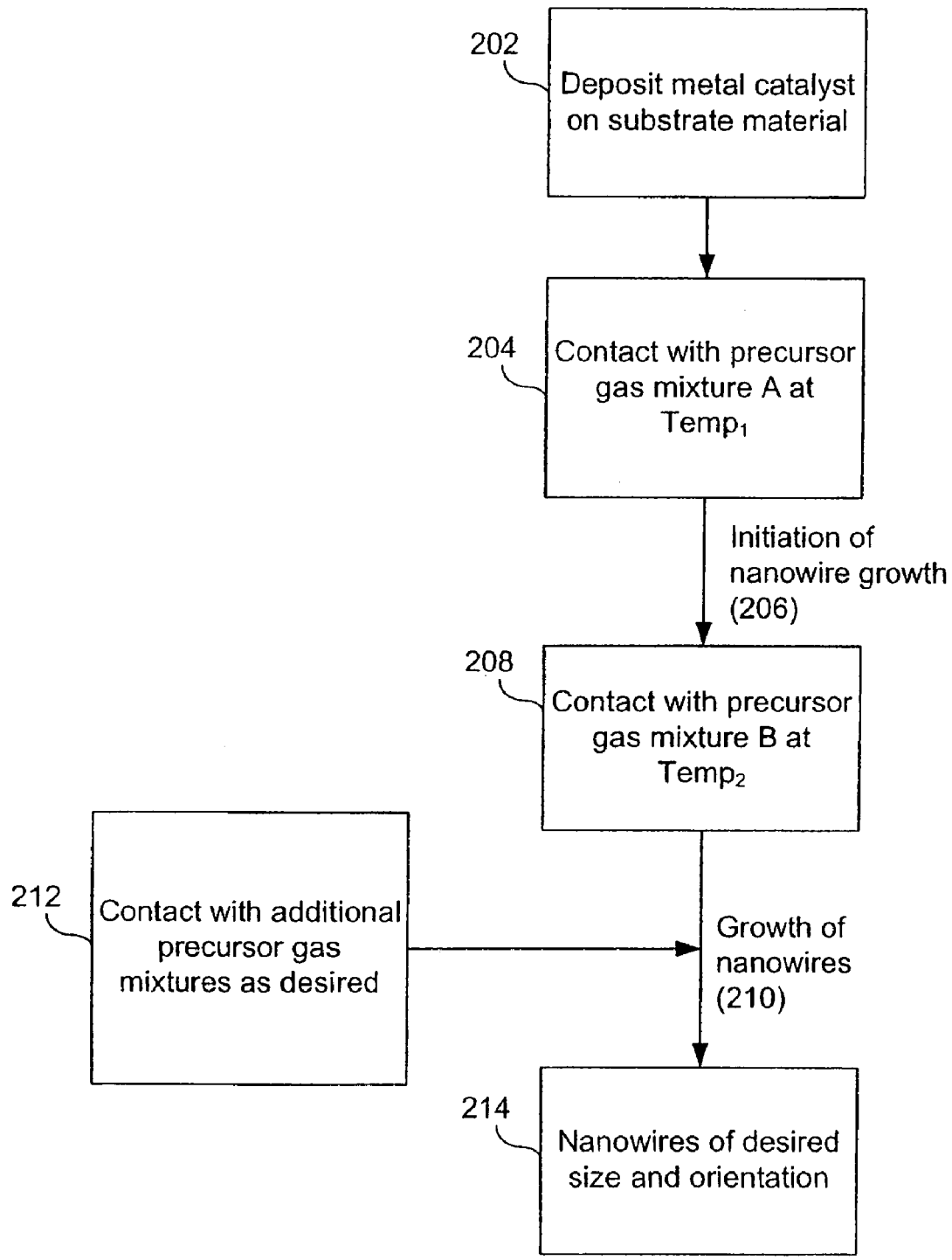
FIG. 2 is a flowchart of a method for preparing nanowires using a combination of Si precursors, according to an embodiment of the invention.

FIG. 2 is a flowchart of method 200 for preparing nanowires using a combination of Si precursors, according to an embodiment of the invention. Method 200 begins in step 202. In step 202, one or more nucleating particles, suitably metal catalysts, are deposited on a substrate material to create a nucleation site for nanowire growth. As shown in step 204, heating of the nucleating particles to a first temperature and contacting the nucleating particles with a first precursor gas mixture, creates a liquid alloy droplet and initiates nanowire growth, which is indicated by label 206. In step 208 heating the alloy droplet to a second temperature and contacting the alloy droplet with a second precursor gas mixture, allows nanowires to grow at the site of the alloy droplet, which is indicated by label 210, until they reach the desired size and orientation, as shown in step 214.

In suitable embodiments, the substrate material on which the nanowires are grown is a crystallographic substrate. The term "crystallographic substrate" includes any substrate material which comprises atoms situated in a repeating or periodic array over large atomic distances, typically on the order of 10 or more angstroms (Å). Such crystallographic substrates may be polycrystalline or may comprise single crystals. Suitably, the crystallographic substrate utilized in the processes of the present invention is silicon (Si). Other suitable crystallographic materials included, but are not limited to, germanium (Ge), gallium arsenide (GaAs), gallium nitride (GaN), sapphire, quartz, and silicon germanium (SiGe). In other embodiments of the present invention, the substrate material may comprise an amorphous material. Suitable amorphous substrate materials which may be used in the practice of the present invention include, but are not limited to $SiO_2$, $Si_3N_4$ and alumina. In additional embodiments, substrate materials are composed of multiple layers, such as a silicon on insulator (SOI) surface.

As outlined in FIG. 2, in certain embodiments, the methods of the present invention comprise first depositing nucleating particles on a substrate material. Nucleating particles that may be used in the practice of the present invention include metal catalysts and can be any metal that reacts with both the first precursor gas mixture and the second precursor gas mixture (i.e., decomposed forms of the first and second precursor gas mixtures) to form a eutectic phase. Such a mixture has a minimum melting point at which all components are in solution. Upon addition and decomposition of precursor gas molecules (e.g., silicon) a saturation point on the eutectic phase diagram is reached such that semiconductor particles (e.g., Si) begin to precipitate out of the metal solution, thereby creating a growing nanowire. Continuous addition of precursor gas, as it decomposes, will continue to saturate the eutectic, thereby generating additional material for nanowire growth.

In suitable embodiments, the nucleating particles will be metal catalysts and can comprise any of the transition metals from the Periodic Table, including, but not limited to, copper, silver, gold, nickel, palladium, platinum, cobalt, rhodium, iridium, iron, ruthenium, tin, osmium, manganese, chromium, molybdenum, tungsten, vanadium, niobium, tantalum, titanium, zirconium and gallium, including mixtures of one or more of these metals. In preferred embodiments of the present invention, the metal catalyst can comprise a gold (Au) or aluminum (Al) colloid (i.e., a Au or Al nanoparticle) or Au or Al film. In certain such embodiments, 60 nanometer (nm) diameter gold colloids can be used. The target is to achieve a uniform deposition of gold nanoparticles with density between 2-4 particles per square micrometer ($\mu m$). A key is minimized gold particle cluster formation. The clusters can result in undesired larger diameter nanowire growth. Spin coating and self assembly methods can be explored for the deposition (see e.g., U.S. patent application Ser. No. 10/674,060, filed Sep. 30, 2003, which incorporated by reference herein in its entirety).

Spin coating is a fairly straightforward process. A deposition density can be controlled through variation of the gold particle concentration in the precursor colloids, manipulation of surface chemistry of the silicon wafer, and changing the spin speed. A drawback of spin coating can be low utilization efficiency of gold colloid solution. A recycling process in the production stage can be used if warranted.

Self assembly involves some use of well established chemistry. The surface of 4 inch silicon oxide coated wafer is functionalized with either (3-aminopropyl)-trimethoxysilane (APTMS) or (3-mercaptopropyl)-trimethoxysilane (MPTMS), then contacted with 60 nm gold colloid solution. The gold particles are assembled on the surface. The difference between two different chemistries are compared, and the possibility of controlling the density of gold particles by control of the contact time and gold particle concentration in the contact solution can be used.

The nucleating particles used to practice the present invention can also be formed on a substrate surface by heating a gold film coating layer on the surface.

In one embodiment, the present invention comprises heating the first precursor gas mixture to a temperature at which 1) the gas dissociates into its free component atoms, and 2) the nucleating particles (e.g. metal catalyst) melts to a liquid. The free gas molecules can then diffuse into the metal catalyst to form a liquid alloy droplet. This process is commonly known to those of ordinary skill in the art as chemical vapor deposition (CVD).

In suitable embodiments of the present invention, the first precursor gas may comprise a gas which includes at least one atomic species that promotes the growth of nanowires (e.g., Si) as well as an atomic species that aids in orienting the nanowires during their growth (e.g., Cl atoms). For example, the first precursor gas may be selected from, but not limited to, $Si_2H_6$, $SiH_4$, $SiCl_4$ and $SiH_2Cl_2$ gas, preferably $SiCl_4$ or $SiH_2Cl_2$.

Heating these Si precursor gases above the temperature at which the thermal energy is sufficient to break the bond energies between the gaseous molecules generates free Si atoms. (e.g., Si—H bond: 93 kcal/mole, Si—Cl bond: 110 kcal/mole, Si—Si bond; 77 kcal/mole, see M. T. Swihart and R. W. Carr, *J. Phys Chem A* 102:1542-1549 (1998).) Provided that this temperature is also high enough to liquefy the metal catalyst, the free Si atoms will diffuse into the metal and generate a eutectic phase. Dissociation temperatures for $SiH_4$ and $Si_2H_6$, and $SiCl_4$ and $SiH_2Cl_2$ gases are between about 300° C. to 500° C. (for $Si_2H_6$ and $SiH_4$), and above about 800°

C. (for $SiCl_4$ and $SiH_2Cl_2$) respectively. In the instances of $SiCl_4$ or $SiH_2Cl_2$, Cl atoms are also generated. Decomposition of $SiCl_4$ or $SiH_2Cl_2$ into Si and Cl in the presence of a carrier gas (e.g., $H_2$, $H_2Ar$) forms HCl.

As discussed in more detail below, this creates a competition between etching with HCl and growth from the Si vapor. Chlorine aids in removal of interfacial oxide on Si substrates leading to oriented NW growth. However, because the decomposition of $SiCl_4$ or $SiH_2Cl_2$ into Si and Cl occurs at a relatively high temperature (e.g., above about 800° C.), metal diffusion of the metal catalysts into the growing nanowires is more likely to occur if the temperature is maintained above about 800° C. for an extended time period.

Furthermore, at higher temperatures, the loss of metal catalyst is more likely to occur due to increased melting of the catalyst leaving less catalyst (or none) available to promote growth of the nanowires, thus limiting the length to which the nanowires can be grown. Accordingly, following the initiation of nanowire growth and orientation with $SiCl_4$ or $SiH_2Cl_2$, it is preferable to introduce another precursor gas mixture (including, e.g., $Si_2H_6$ or $SiH_4$) to contact the metal catalyst, which gas mixture includes a precursor gas which decomposes into Si atoms at lower temperatures than the first precursor gas (but at a high enough temperature to form a eutectic phase with the metal catalyst).

In all embodiments of the present invention, the precursor gas mixtures used during any of the nanowire growth processes may further comprise one or more doping gases. Examples of suitable doping gases that may be used in the practice of the present invention include, but are not limited to, $B_2H_6$, trimethyl boron (TMB) $POCl_3$ and $PH_3$.

In one embodiment of the present invention, the first precursor gas can comprise $SiCl_4$ and suitably a carrier gas, such as He, Ar, or other inert gas. Heating this gas mixture to a sufficiently high temperature, e.g., above about 800° C., generates free Si and Cl atoms. In suitable such embodiments, the first precursor gas may comprise one or more dopant gases selected from those described throughout the application. The first precursor gas mixture is passed over the nucleating particles, suitably metal-catalyst particles (e.g., gold nanoparticles) deposited on the substrate material at a total pressure between about 20 to about 50 Torr, while the nucleating particles are heated up to a temperature of about 800° C. In other embodiments of the present invention, the gas pressure may be increased or decreased, thereby requiring a modification in the temperature required to dissociate the precursor gas mixture.

For example, $SiCl_4$ when heated to the appropriate temperature will decompose into free Si and Cl atoms. When $B_2H_6$ is present in the precursor gas mixture, B atoms will also be generated. Si and B will diffuse into the metal catalyst and generate a liquid alloy droplet. This eutectic phase of metal catalyst and precursor gases will continue to exist as precursor gas is solvated in the metal catalyst. Once an oversaturation is reached, Si/B atoms will precipitate out and initiate nanowire growth. In order to continue nanowire growth, a continuous supply of Si precursor gas and doping gas are required. However, maintaining a temperature above about 800° C. for extended periods can lead to the metal catalyst diffusing into the growing nanowire creating trap states and reducing the diameter and length of the overall nanowire that can be obtained.

In certain embodiments of the present invention, once nanowire growth is initiated (e.g., using $SiCl_4$ or $SiH_2Cl_2$), a second precursor gas can be substituted (e.g., $SiH_4$) and nanowire growth continued. The point at which the second precursor gas is introduced into the system can be determined experimentally by the skilled artisan. In other embodiments of the present invention, nanowire growth can be initiated using $SiH_4$ and then followed with $SiCl_4$ or $SiH_2Cl_2$ as a second precursor gas thereby allowing for Cl etching. In certain such embodiments, the first temperature at which the first precursor gas mixture is added to initiate nanowire growth and the second temperature at which nanowire growth is continued using a second precursor gas mixture can be the same, so long as the temperature used is high enough to allow for dissociation of the gases and diffusion of Si and dopant into the liquid metal catalyst. In other embodiments, the first temperature used to initiate nanowire growth will be higher than the second temperature used to continue nanowire growth. These temperatures can differ by any amount (e.g., about a few degrees C. to 10's of degrees C. to 100's of degrees C.), so long as the temperatures used are high enough to allow for dissociation of the gases and diffusion of Si and dopant into the liquid metal catalyst.

In certain embodiments of the present invention, once nanowire growth is initiated, suitably using a temperature of about 800° C. and $SiCl_4$ or $SiH_2Cl_2$ as a first precursor gas, a second precursor gas can be substituted and the temperature changed to continue nanowire growth. The point at which the second precursor gas is introduced into the system can be determined experimentally by the skilled artisan. In certain such embodiments, the first temperature at which nanowire growth is initiated will be higher than the second temperature, where nanowire growth continues. In suitable embodiments, the second precursor gas will comprise $SiH_4$ and growth will continue at a temperature of about 300° C. to about 500° C. In certain embodiments, the first temperature will be at least about 50° C. above the second temperature. Continuing to grow the nanowire at a lower temperature reduces the possibility that the metal catalyst can diffuse into the growing nanowire.

The present invention encompasses the use of any number of precursor gases in the process of growing nanowires. For example, nanowire growth can be initiated with a first precursor gas comprising $SiCl_4$, suitably at a temperature of about 800° C., and then continued with a second precursor gas comprising $SiH_2Cl_2$, suitably at a temperature of about 750° C. In other embodiments, $SiH_2Cl_2$ can be used as the first precursor gas. The wires then can be contacted with a third precursor gas, comprising, for example $SiH_4$ or $Si_2H_6$, suitably at a temperature of about 300-500° C. As shown in FIG. 2 in step 212, in other embodiments of the invention, any number of precursor gases can be introduced to the nanowires during the initiation and growth processes, until the nanowires reach the desired size and orientation, which is indicated in step 214. Provided that as long as the temperature at which the precursor gases contact the metal catalyst is above the dissociation temperature of the gas mixture and above the temperature required to liquefy the metal catalyst, the wires will continue to grow, as Si (or other suitable semiconductor materials as discussed throughout) and the dopant will continue to precipitate out of the metal catalyst allow droplet.

In certain embodiments, nanowire growth can be initiated using $SiH_4$ or $Si_2H_6$ and then continued using $SiCl_4$ or $SiH_2Cl_2$ to allow for Cl etching of Si growing in undesired locations and orientations on the substrate surface. The precursor gas mixture may then be switched back to $SiH_4$ or $Si_2H_6$ if desired. In certain such embodiments, the temperature at which the three gases can be kept the same, or can be modified as needed, so long as free Si atoms are allowed to mix with the liquefied metal catalyst. In other embodiments of the present invention, free Si, Cl or H atoms may be supplied to the growing nanowires to aid in growth (e.g., Si), etching (e.g., Cl) or gas dissociation (e.g., H) as needed.

As discussed throughout, the precursor gas mixtures used in the processes of the present invention may further comprise a dopant. In suitable embodiments of the present invention, wires can be grown using the same doping gas in each of the precursor gas mixtures. In such embodiments, the entire resulting wire will be either p-type or n-type, depending on the choice of dopant. In other embodiments of the present invention, different doping gases can be introduced throughout the process as components of the different precursor gases. For example, wire growth can be initiated using a precursor gas comprising a n-type dopant (e.g., P, As or Sb) and then continued using a precursor gas using a p-type dopant (e.g., B, Al or In). In other embodiments, a p-type doing gas will be used during initiation and then an n-type doping gas during growth.

In other embodiments, the type of doping gas can be switched multiple times throughout the growth process as the precursor gases are switched. The resulting nanowires therefore can comprise several different dopant portions throughout their length. For example, a nanowire produced via the present invention may comprise an n-type base, a p-type middle section, and an n-type top, or any suitable combination as envisioned by the ordinarily skilled artisan. Such embodiments of the present invention would allow for an n-type wire to be grown on a p-type substrate, and vice versa.

Continuously supplying the second precursor gas mixture (and third, fourth, fifth, etc.) will allow the nanowire to continue growing until termination by desire or death caused by local condition change. The quality of the nanowires is dependent on the quality of gold nanoparticles, control of gold nanoparticle distribution on the substrate and growth condition including temperature, ratio of dopant to precursor gas, partial pressure of the precursor gas, and resident time of precursor gases in the reactor. In suitable embodiments of the present invention, the processes of the present invention can be accomplished using a computer controlled 8" semiconductor furnace.

In suitable embodiments, the various precursor gas mixtures that are introduced in any of the processes of the present invention may be introduced via Plasma Enhanced Sputter Deposition (or Plasma Enhanced Chemical Vapor Deposition (PECVD)) and the processes performed at lower temperatures. (See Hofmann et al., "Gold Catalyzed Growth of Silicon Nanowires by Plasma Enhanced Chemical Vapor Deposition," *J. Appl. Phys.* 94:6005-6012 (2003).) Decomposition of $SiCl_4$ or $SiH_2Cl_2$ into Si and Cl in the presence of a carrier gas (e.g., $H_2$, $H_2Ar$) forms HCl. This creates a competition between etching with HCl and growth from the Si vapor. Chlorine aids in removal of interfacial oxide on Si substrates leading to the oriented NW growth. Loss of metal catalyst (e.g., Au or Al) can occur either by etching or thermal evaporation of AuCl that can form. Use of PECVD to grow NWs at temperatures below about 800° C., with the addition of chlorine gas from $SiCl_4$ or $SiH_2Cl_2$, and/or the addition of chlorine gas from a source separate from the source of $SiCl_4$ or $SiH_2Cl_2$, the reactive species of Si and Cl can be independently controlled in the plasma to enhance or suppress etching as needed to promote nanowire growth. Sputter deposition can be accomplished via any method known to the ordinarily skilled artisan, for example, diode, radio frequency and direct current deposition.

The diameter distribution of silicon nanowires of these certain embodiments of the present invention is determined by that of the nucleating particles, e.g., metal (suitably gold) nanoparticles. Commercially available 60 nanometer gold colloids can have a diameter distribution of ±10%. The same distribution can be attained in the nanowires. Gold nanoparticles can be split into smaller ones resulting in smaller diameter nanowires, depending on the growth condition. Growth conditions can be optimized to minimize this event. Given a growth condition, the length of nanowires can be controlled by varying duration of the growth. Crystallinity of silicon nanowires and dopant concentration are also growth condition dependent. They can be optimized and controlled together with other important nanowire characteristics.

The nanowires produced according to any of the processes of the present invention will suitably grow out of the plane of the substrate material. Such growth includes nanowires that project out of the plane of the substrate material at any angle with respect to the substrate. For example, nanowires can grow at an angle of about 1° to about 90°, and any angle in between these values, relative to the plane of the substrate material. It is a requirement of the present invention that the nanowires produced by the processes described herein must project out of the plane of the substrate. That is, the nanowires produced by the processes of the present invention must extend off of the plane of the substrate material a distance greater than the dimension of a single molecule. As such, the nanowires produced according to the present invention are distinct from structures such as thin films and quantum dots, which spread on the surface of a substrate material, rather than growing in a manner such that they project out of the plane of the substrate a distance that exceeds the atomic diameter of a single Si molecule for instance.

Suitably, the nanowires produced according to any of the processes of the present invention will project out of the plane of the substrate material so as to attain a final length of about 100 nm to less than about 1 µm. In suitable such embodiments, the nanowires produced according the present invention can attain a final length of a few 100 nms. The nanowires of the present invention will suitably be at least about 1 nm n to less than about 1 µm in diameter. For use in electronic devices, the nanowires of the present invention will have a diameter of about a few nms to 100's of nms, so as to allow them to be harvested and utilized in an electronic device, suitably by placing the wires in plastic substrates so as to act as conductive media. (See U.S. Application No. 60/491,979, filed Aug. 4, 2003, for a description of nanowire harvesting which is incorporated herein by reference.)

In suitable embodiments of the present invention, the nanowires, when growing on a crystalline substrate (whether polycrystalline or single crystal) will preferably grow in an epitaxial orientation. However, the present invention also embodies growth on crystalline substrates wherein the nanowires do not grow in an epitaxial orientation. As used herein, the term epitaxial as it refers to the growth of nanowires means that the nanowires have the same crystallographic characteristic(s) as the substrate material on which they are growing. For example, the orientation of the substrate material can be any crystallographic orientation known to the ordinarily skilled artisan, including, but not limited to, <111>, <110>, <100> and <211>. In suitable embodiments then, the nanowires produced by the processes of the present invention can be grown in any crystallographic orientation, and suitably in the same orientation as the substrate material, including those orientations discussed throughout and as known to the ordinarily skilled artisan.

As discussed throughout, suitable precursor gases that can be used in the processes of the present invention comprise $SiCl_4$ and $SiH_2Cl_2$. Dissociation of these gasses generates free chloride ions (Cl) in the gas phase. These Cl ions, and/or additional chlorine ions introduced from a separate source of chlorine gas, act to etch the growing Si nanowires in an orientation that is preferentially a <111> orientation.

In other suitable embodiments of the present invention, the crystallographic plane of the substrate material can be off axis of the 0° horizontal plane. The nanowires growing on the surface of such a substrate material can project out of the substrate material at an angle such that the wires can be normal to the crystallographic plane (i.e., 90° with respect to the crystallographic plane) or can be off axis relative to the crystallographic plane such that they can be normal to a 0° horizontal plane.

In embodiments of the present invention where amorphous substrates are utilized, the nanowires produced according to the processes of the present invention will not grow epitaxially, as the amorphous material does not comprise a crystallographic orientation. However, as noted above, the nanowires grown on such substrates may project out of the plane of the substrate at any angle relative to the horizontal plane.

The processes of the present invention produce nanowires that may carry electrons between two points in space and thus act to transfer charge. In this way, the nanowires of the present invention are further distinct from nanodots and in their size and orientation, are distinct from semiconductor films.

Figure 3:
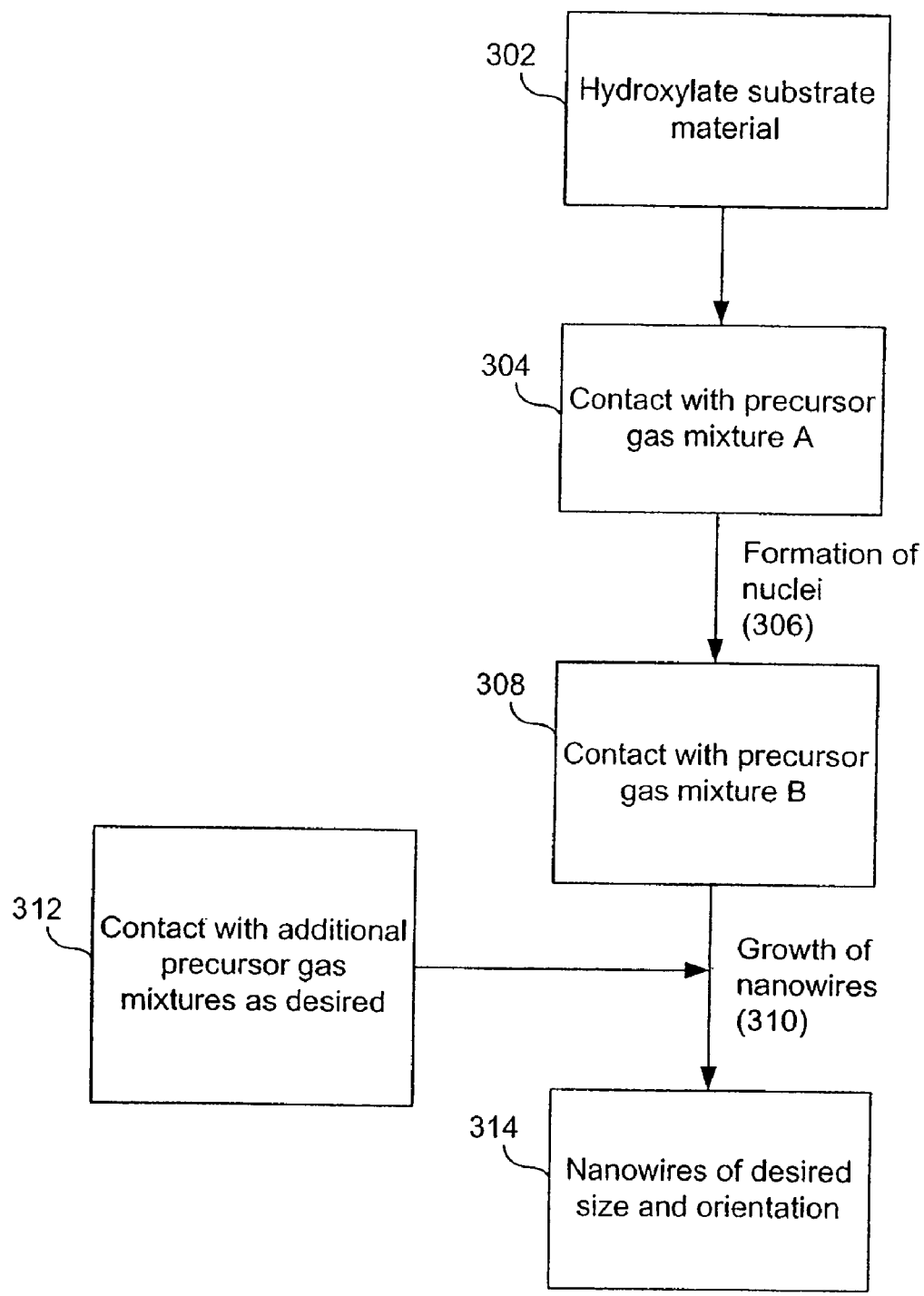
FIG. 3 is a flowchart of a method for preparing nanowires using a combination of Si precursors, according to an embodiment of the invention.

In another embodiment, the present invention provides for processes for producing nanowires which does not require a starting metal catalyst, as outlined in FIG. 3. FIG. 3 is a flowchart of a method for preparing nanowires using a combination of Si precursors which does not require a starting metal catalyst, according to an embodiment of the invention. Method 300 begins in step 302. In step 302 a substrate material is hydroxylated to produce nucleation sites. In step 304 contacting the substrate material with a first precursor gas mixture generates one or more nuclei on a surface of the substrate material, which is indicated by label 306. In step 308 contacting the nuclei with a second precursor gas mixture, allows nanowires to grow at the site of the one or more nuclei, as indicated by label 310, until they reach the desired size and orientation, which is shown as step 314.

This process of the present invention does not require the use of a metal catalyst to provide a nucleation site for the nanowire, and therefore eliminates the problems and concerns that arise due to metals diffusing into the growing nanowires. A similar process has been described by De Salvo et al. for the production of nanocrystals in the form of nanodots ("How far will Silicon nanocrystals push the scaling limits of NVMs technologies?," *IEEE Proceeding, Session 26*, p. 1 (2003)), but has not been extended to the production of nanowires as in the present invention.

As discussed throughout, any suitable substrate material may be used for the processes of the present invention. Suitably, the substrate material will be crystallographic, including both polycrystalline and single crystal substrates. In certain embodiments, the substrate material utilized in this embodiment of the present invention will comprise silicon. In other suitable embodiments of the present invention, the substrate material will be an amorphous material, including but not limited to, $SiO_2$, $Si_3N_4$, or alumina.

Hydroxylation of the substrate material in these embodiments of the present invention can be generated by any suitable process known to the ordinarily skilled artisan. For example, hydroxylation of a substrate material of the present invention can be generated by chemical treatment of the substrate material with diluted HF solution. Generation of hydroxyl groups on the surface of the substrate material create nucleation points for Si or other semiconductor materials to deposit and initiate nanowire growth.

Following hydroxylation, the substrate material is then contacted with one or more precursor gas mixtures to allow nucleation and initiation of nanowire growth. Any precursor gas mixture known to the ordinarily skilled artisan can be used in the processes of the present invention, and suitably can comprise dopants. Examples of precursor gases useful in the practice of the present invention comprise, but are not limited to, $SiH_4$, $Si_2H_6$, $SiCl_4$ and $SiH_2Cl_2$, preferably $SiH_4$ or $Si_2H_6$, which nucleates particles on the surface of the substrate, and in suitable embodiments may further comprise dopants such as, but not limited to, $B_2H_6$, TMB, $POCl_3$ and $PH_3$. The temperature for dissociation and nucleation of the nanowires is dependent upon the dissociation temperature of the precursor gas mixture as discussed throughout. In suitable embodiments, this temperature is at least about 300° C., but is optimized based on the dissociation temperature of the precursor gas mixture as discussed throughout. In certain such embodiments, the first precursor gas mixture will comprise $SiH_4$.

Following nucleation and initiation of growth, the substrate material is then contacted with one or more second precursor gas mixtures as described throughout, and suitably can comprise $SiH_4$, $Si_2H_6$, $SiCl_4$ or $SiH_2Cl_2$, preferably $SiCl_4$ or $SiH_2Cl_2$, and may further comprise $B_2H_6$, $POCl_3$ or $PH_3$. In certain embodiments, the second precursor gas mixture will comprise $SiCl_4$ or $SiH_2Cl_2$. Use of such precursor gases will allow for growth in a <111> orientation when grown on a crystallographic substrate as a result of etching from the dissociated Cl as discussed above. In other embodiments of the invention, as shown in step 312 of FIG. 3, any number of precursor gases may be introduced to the nanowires during the initiation and growth processes, as long as one or more of the precursor gases is capable of nucleating particles on the surface of the substrate, and one or more precursor gas(es) aids in orienting the nanowires during the growth process (e.g., via etching). Provided further that as long as the temperature at which the wires contact the metal catalyst is above the dissociation temperature of the gas mixture, the wires will continue to grow. In other embodiments free H, Cl or Si atoms can be added to the growing nanowires as discussed throughout. As discussed throughout, the processes of the present invention can be used to produce nanowires that comprise various dopants and different regions of these dopants throughout the length of the nanowire.

In embodiments of the present invention where crystallographic substrates are utilized, the nanowires produced will preferably grow in an epitaxial orientation, though the present invention also encompasses embodiments where growth on crystallographic substrates is not epitaxial. The processes of the present invention, as discussed throughout, produce nanowires that grow and project out of the plane of the substrate material. As such, the nanowires of the present invention are distinct from nanodots that do not grow in such an orientation, but rather remain in the plane of the substrate material. The present invention, by providing Si structures that project out of the plane of the substrate material, allow for the production of nanowires that can be used to transport electrical charge as discussed throughout.

In an embodiment, a method for producing nanowires, includes hydroxylating a substrate material; contacting the substrate material with a first precursor gas mixture comprising a first precursor gas that is capable of forming one or more nucleated particles on a surface of the substrate material; contacting the one or more nucleated particles with a second precursor gas mixture, comprising at least one atomic species that aids in orienting the growing nanowires; and growing nanowires at the site of the one or more nucleated particles. In an aspect of this embodiment the first precursor gas mixture comprises $SiH_4$ or $Si_2H_6$. In another aspect of this embodiment the second precursor gas mixture comprises $SiCl_4$ or $SiH_2Cl_2$. In another aspect of this embodiment the second precursor gas mixture comprises chlorine gas from an independent chlorine gas source which is separate from the source of $SiCl_4$ or $SiH_2Cl_2$ gas. Nanowires can be produced by this method. Electronic circuits including nanowires produced by this method can also be produced.

The present invention also provides for nanowires produced by any of the processes of the present invention. As discussed throughout, nanowires produced by the processes of the present invention will suitably be of a length of at least about 100 nm and at least about 1 nm to less than about 1 μm in diameter, and may comprise various dopants (i.e., p- and n-type regions) throughout their length.

The present invention also provides for electronic circuits comprising the nanowires produced by any of the processes of the present invention. Suitably collections of nanowires produced according to the processes of the present invention are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

The nanowires of the present invention can also be used to make high performance composite materials when combined with polymers/materials such as organic semiconductor materials, which can be flexibly spin-cast on any type of substrate. Nanowire/polymer composites can provide properties superior to a pure polymer materials. Further detail on nanowire/polymer composites is provided below.

Collections or thin films of nanowires of the present invention can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/V \cdot s$.

Aligned thin films of nanowires of the present invention can be obtained in a variety of ways. For example, aligned thin films of nanowires can be produced by using the following techniques: (a) Langmuir-Blodgett film alignment; (b) fluidic flow approaches, such as described in U.S. Ser. No. 10/239,000, filed Sep. 10, 2002, and incorporated herein by reference in its entirety; and (c) application of mechanical shear force. For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the created thin film of nanowires. For example, nanowires can be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

P-doped nanowires and n-doped nanowires produced by the processes of the present invention can be separately fabricated, and deposited in a homogeneous mixture onto a surface, such as a macroelectronic substrate. On a macroscopic level, the resulting material appears to contain a high concentration of both n- and p-dopants. By creating such a mixture of p- and n-doped nanowires, macroelectronic devices can be fabricated that respond as if they are both n- and p-doped. For example, a resulting thin film of nanowires that includes both n-doped and p-doped nanowires can exhibit characteristics of both n-doped and p-doped nanowires. For example, diode, transistor, and other known electrical devices can be fabricated to include a combination of p-doped nanowires and n-doped nanowires.

Nanowires produced by the processes of the present invention can also be used to produce electrical devices such as p-n diodes, transistors, and other electrical device types, using nanowire heterostructures as described herein. Nanowire heterostructures include a plurality of p-n junctions along the length of the nanowire and can include alternating portions or segments along their lengths that are differently doped.

Oriented Growth of Nanowires on Patterned Substrates

In another embodiment, the present invention provides methods for producing nanowires, comprising: applying a catalyst-repelling material on a substrate material to at least partially cover the substrate material; applying one or more nucleating particles on the substrate material; heating the nucleating particles to a first temperature; contacting the nucleating particles with a first precursor gas mixture to create a liquid alloy droplet to initiate nanowire growth; heating the alloy droplet to a second temperature; and contacting the alloy droplet with a second precursor gas mixture, whereby nanowires are grown at the site of the alloy droplet.

Figure 24:
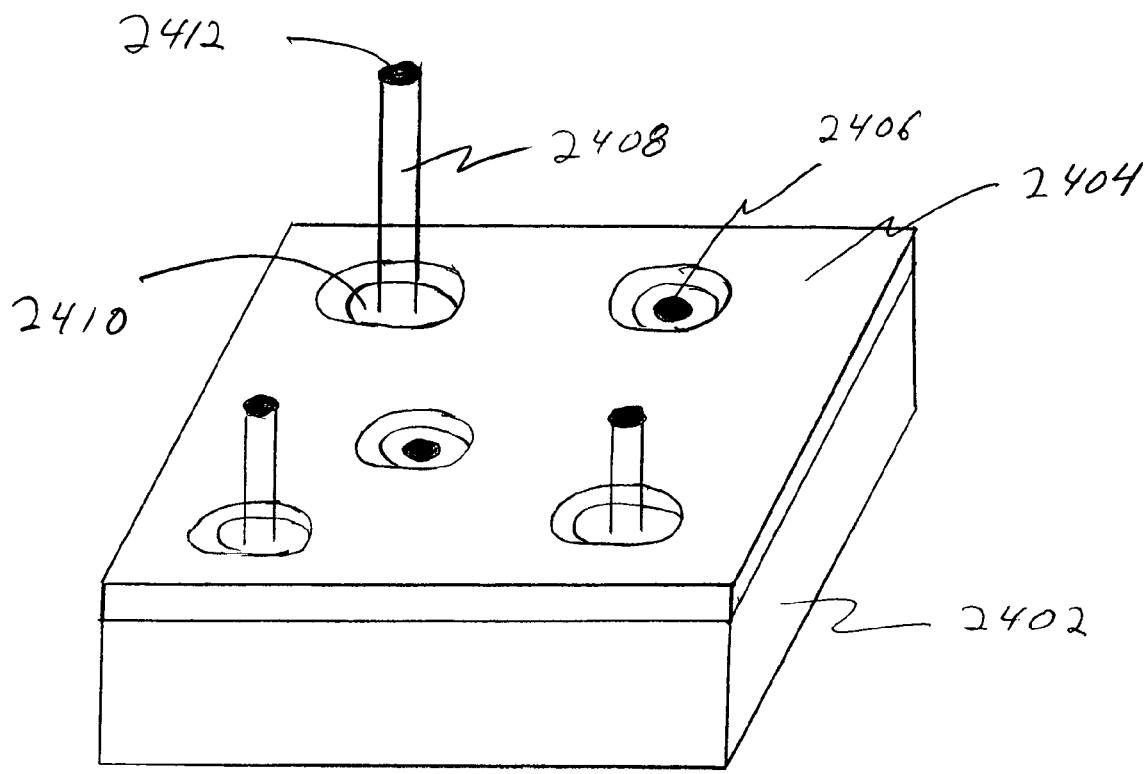
FIG. 24 is a diagram showing oriented nanowire growth using a patterned substrate in accordance with one embodiment of the present invention.

FIG. 24 shows a diagram of oriented nanowire growth using a patterned substrate in accordance with one embodiment of the present invention. It should be noted that FIG. 24 is not to scale and is simply provided to illustrate certain aspects of oriented nanowire growth on patterned substrates in accordance with this embodiment of the present invention. As shown in FIG. 24, a substrate material 2402, suitably a crystallographic substrate, such a silicon or other semiconductor material, is provided. A catalyst-repelling material 2404 is applied on substrate material 2402 to at least partially cover the substrate material 2402. As used herein, the term "applying" or applied refers to any suitable method for preparing a catalyst-repelling material 2404 on a substrate material 2402, and includes, layering depositing, spraying, coating, etc. As used herein the phrase "at least partially cover the substrate material" means that the catalyst-repelling material 2404 covers at least 1% of the surface area of substrate material 2404. Suitably, the catalyst-repelling material 2404 will cover at least about 10%, at least about 20%, at least about 30%, at least about 40%, at least about 50%, at least about 60%, at least about 70%, at least about 75%, at least about 80%, at least about 90%, or at least about 95% of the surface area of substrate material 2402.

As used herein the term "catalyst-repelling material" includes any material which does not allow a catalyst material to substantially bond, affix, interact, or attach thereto. Catalyst-repelling materials for use in the present invention suitably do not allow nucleating catalyst particles to bond or attach to their surface, thereby creating a repelling effect whereby nucleating particles do not, or cannot, attach, and as such are driven to areas of the substrate material which are not covered by the catalyst-repelling material. In other embodiments, nucleating catalyst particles are driven from the catalyst-repelling material, or leave, for example during application (evaporation) or heating of the catalyst material. Examples of catalyst-repelling materials include, but are not limited to SiO$_2$ and anodic alumina. As shown in FIG. 24, in suitable embodiments, catalyst-repelling material 2404 will be patterned or otherwise prepared such that the material at least partially covers substrate material 2402. In suitable embodiments, catalyst-repelling material 2404 comprises voids 2410 in the material that expose substrate material 2402 below. The term "voids" as used herein includes, holes, openings, cracks, or other suitable patterns that expose portions of substrate material 2402, while continuing to at least partially cover substrate material 2402. Suitably, voids 2410 are spaced throughout the catalyst-repelling material 2404 such that when nanowires are grown at the sites of the voids, they are spaced far enough from each other such that they don't contact or disturb other growing nanowires. Any suitable orientation of voids 2410 can be used. In addition, voids 2410 can be any desirable shape, for example, circular, square, random, etc. In suitable embodiments, voids 2410 are randomly spaced across catalyst-repelling material 2404 to create a variety of shapes and spacings. In other embodiments, voids 2410 can be evenly spaced, or in an oriented pattern, throughout catalyst-repelling material 2404, for example as a checkerboard, or other application-specific pattern. Voids 2410 can either be created in catalyst-repellign material 2404 simply by forming them during initial application (i.e., by forming them around a void opening or "mold"), or they can be generated. For example, voids 2410 can be generated by removing catalyst-repelling material to expose substrate material 2402 via any suitable method, for example, by etching, cutting, scraping, drilling or similar method.

Catalyst-repelling material 2404 can be any suitable thickness that will prevent nucleating particles from contacting the substrate surface in areas which are desired to be covered. Suitably, catalyst-repelling material 2404 will be on the order of several nanometers to a few microns in thickness, though thicker material can also be used.

One or more nucleating particles 2406 are then applied to the substrate material 2402. When nucleating particles 2406 contact catalyst-repelling material 2404, the particles are repelled and move to open voids 2410 where substrate material 2402 is exposed, or leave the substrate all together (e.g., during an evaporation deposition process). Nucleating particles that initially were in contact with the substrate material following application (i.e., contact at the sites of the voids) remain on the substrate material. As described herein, nucleating particles are suitably metallic catalysts that react with decomposed precursor gas mixture(s) to form a eutectic from which Si precipitates, such as described throughout. For example, Au, Al, Pt, Fe, Ti, Ga, Ni, Sn or In can be deposited. Nucleating particles 2406 can be deposited as colloid droplets directly on the surface of substrate surface 2404. In additional embodiments, colloid droplets can be deposited on catalyst-repelling material 2404, at which time, assuming they are in a liquid state, they will move back into solution and may subsequently migrate from the catalyst-repelling material to the voids 2410 where they will contact substrate material 2402.

In additional embodiments, nucleating particles can comprise metallic films, such as gold, aluminum or other metal films. Depositing a metallic film on catalyst-repelling material 2404 cause the metallic catalyst to migrate to open voids 2410 in the material where it will enter the voids and then contact substrate material 2402, or leave the substrate all together (e.g., during an evaporation deposition process). Nucleating particles that initially were in contact with the substrate material following application (i.e., contact at the sites of the voids) remain on the substrate material. In cases of both metallic colloids and metallic films, the catalyst material will migrate to open areas of the patterned catalyst-repelling material 2404, or leaves the catalyst-repelling material, assuming that the catalyst is in a liquid state. Catalyst material can either be deposited in a liquid state, or can be deposited in a solid state and then heated to a temperature where it melts and can flow/migrate or leave/evaporate. At this elevated temperature, metallic catalyst that is in contact with catalyst-repelling material 2404 can migrate to open voids 2410 and contact substrate material 2402. Alternatively, at the elevated temperature, the metallic catalyst in contact with the catalyst-repelling material leaves (e.g., evaporates) while the metallic catalyst that is in contact with the underlying substrate (i.e., in the void) coalesces into a metallic particle that can be alloyed with the substrate. Migration and/or coalescence of the nucleating particles can occur just prior to, or at the beginning, of the nanowire growth process.

Once the nucleating particles 2406 are deposited on substrate material 2402, either directly or after leaving or migrating from catalyst-repelling material 2404, the nucleating particles 2406 are heated and contacted with a first precursor gas mixture to create a liquid alloy droplet 2412, thereby initiating nanowire 2408 growth. Suitable growth conditions, including temperatures and times, are described herein and also well known to the ordinarily skilled artisan. Suitable first precursor gases include those described herein, and include gases comprising, but not limited to, SiH$_4$, SiCl$_4$ and SiH$_2$Cl$_2$. The use of catalyst-repelling material 2404, in addition to aiding in deposition of nucleating particles, also helps to keep nucleating particles 2406 from migrating during nanowire growth. If nucleating particles 2406 are heated in the absence of catalyst-repelling material 2404, they can often migrate on substrate material 2402 and coalesce into larger nucleating particles. This can compromise nanowire diameter and structure. In addition to problems with coalescence, catalyst-repelling material 2404 also helps to keep nucleating particles 2406 and growing nanowires 2408 properly spaced and oriented, thereby reducing tangling and other complications.

Alloy droplet 2412 is then heated to a second temperature, and contacted with a second precursor gas mixture, to continue nanowire growth at the site of the alloy droplet. Suitable gases for use as the second precursor gas include those described herein, including, but not limited to, SiH$_4$, Si$_2$H$_6$, SiCl$_4$ and SiH$_2$Cl$_2$. In further embodiments, a third, fourth, fifth, etc., precursor gas mixture can be provided to continue growing the nanowire. In such embodiments, the temperature of the growing nanowires 2408 and alloy droplets 2412 is maintained at a suitable temperature to allow precursor gas dissociation and nanowire growth. Thus, the present invention provides for a continuously varying growth process in which the temperature of the nanowire growth and the precursor gases used can be continuously switched throughout the growth process until the final nanowire composition and characteristics (i.e., length, diameter) are achieved. Suitably, the first temperature used in the nanowire growth methods will be higher than the second temperature, for example about 50° C. higher. Any suitable method can be used to introduce the gases for the nanowire growth process. For example, plasma enhanced sputter deposition can be used to introduce the precursor gas mixtures. Rapid control of the chamber and substrate chamber can be achieved through any method known in the art. For example, a cold wall in an ultra high vacuum (UHV) reactor can be used.

The present invention also provides nanowires produced by such processes of the present invention, and electronic circuits comprising such nanowires.

By combining patterned substrates and varying temperature/precursor gas growth conditions, the nanowires produced according to the methods of the present invention are substantially vertical, oriented nanowires. Suitably, the methods produce epitaxially oriented nanowires that grow substantially normal to the plane of the substrate material. By controlling the deposition of nucleating particles, thereby controlling their migration on the substrate material, nanowire thickness is controlled. The use of varied growth conditions substantially aid in producing nanowires that do not exhibit taper throughout their length, but rather show substantial uniformity throughout.

In further embodiments, the present invention provides methods for producing nanowires, comprising: applying a catalyst-repelling material on a silicon substrate, to at least partially cover the silicon substrate, wherein the catalyst-repelling material comprises at least one void that does not cover the silicon substrate; applying one or more metallic nucleating particles on the catalyst-repelling material, wherein the metallic nucleating particles deposit and coalesce on the silicon substrate, via selective evaporation from the catalyst-repelling material and/or migration to the at least one void. The metallic nucleating particles are then heated to a first temperature and then contacted with a first precursor gas mixture to create a liquid alloy droplet to initiate nanowire growth. The alloy droplet is then heated to a second temperature and contacted with a second precursor gas mixture, whereby nanowires are grown at the site of the alloy droplet. Suitably the nucleating particles will be metallic catalysts, such as metallic films or colloids (e.g., Au or Al films or colloids). The use of crystallographic substrates, such as Si <111> substrates (as well as other crystal orientations and substrate materials), allows for substantially oriented (suitable epitaxially oriented), vertical nanowires with substantially constant diameter and little taper. As described herein, suitably the catalyst-repelling material comprises $SiO_2$, or anodic alumina. Examples of precursor gases include those described herein, such as $SiH_4$, $SiCl_4$ and $SiH_2Cl_2$. In additional embodiments, further precursor gas compositions and conditions can be used to continuously vary the growth process.

Methods for Nanowire Synthesis

Figure 4:
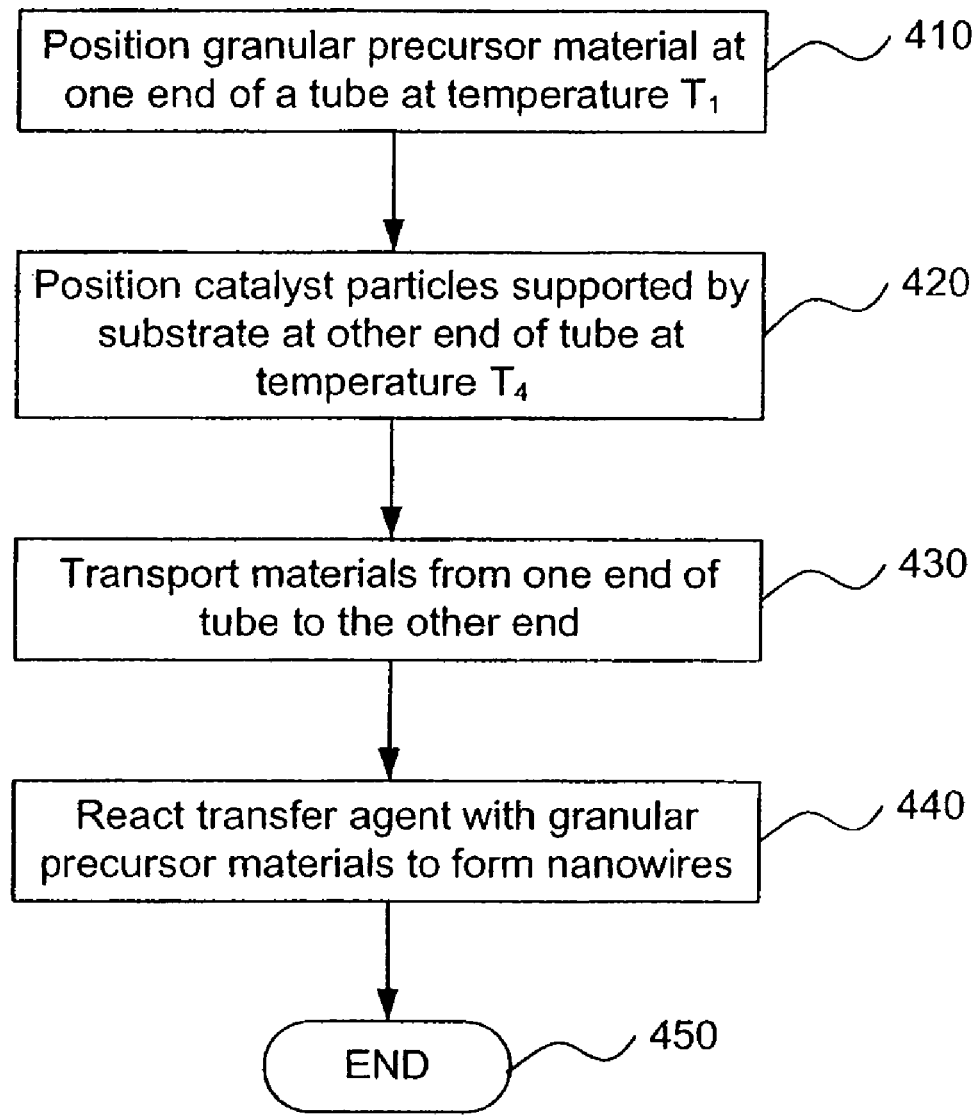
FIG. 4 is a flowchart of a method for nanowire synthesis, according to an embodiment of the invention.
Figure 4A:
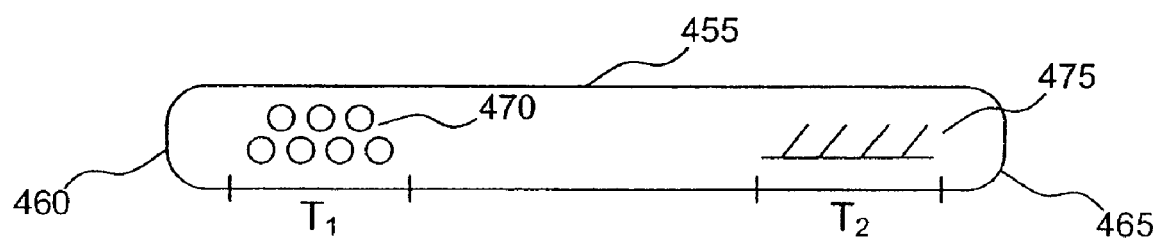
FIG. 4A is a diagram of a nanowire synthesis vessel, according to an embodiment of the invention.

FIG. 4 is a flowchart of method 400 for nanowire synthesis, according to an embodiment of the invention. Method 400 provides a method for synthesis of nanowires using synthesis vessel 455, as illustrated in FIG. 4A. In one embodiment, synthesis vessel 455 is a sealed quartz tube. Synthesis vessel 455 can be, but is not limited to, tubes, pipettes, and the like. The dimensions of synthesis vessel 455 can be varied to meet the particular production needs of the user. In research scale operation, the dimensions for synthesis vessel 455 typically range from six to eighteen inches in length and one-half inch to one inch in diameter. Method 400 begins in step 410. In step 410, a granular precursor material is position at one end of a synthesis vessel, which is at temperature T1. For example, referring to FIG. 4A, precursor material 470 is positioned at end 460 of synthesis vessel 455. Example granular precursor materials can include, but are not limited to Si, CdS and GaN. T1 will be a function of the type of granular precursor material. For example, if the granular precursor material is CdS, then T1 can be in the range from about 800 to 950 degrees centigrade. In this example, T2 would be approximately 50 degrees centigrade less than T1 with some variance based on the type of transport mechanism and transport agent, as would be known by individuals skilled in the relevant arts based on the teachings herein.

In step 420, catalyst particles supported by a substrate are positioned at the other end of a synthesis vessel, which is at temperature T2. For example, referring to FIG. 4A, catalyst particles supported by substrate 470 are positioned at end 465 of synthesis vessel 455. In example embodiments, catalyst particles can include Au or Al when Si is used as the granular precursor material, and Ni when GaN is used as the granular precursor materials.

In step 430, materials are transported from one end of the synthesis vessel to the other. In one embodiment, thermal vaporization is used to transport the granular precursor materials, such as granular precursor materials 470 to the other end of the vessel. In another embodiment, a chemical vapor transport agent can be used to transport the granular precursor material. Chemical vapor transport agents can include, but are not limited to chlorine, iodine, and bromine.

In step 440, a transfer agent is reacted with the granular precursor materials to form nanowires. In particular, the transfer agent reacts with granular precursor materials at T1 to form a volatile compound, which will diffuse to the surface of catalyst particles and decompose to grow nanowires at T2. At the same time, the transport agent is regenerated and ready for another cycle to produce more nanowires. The growth cycle will continue until the process is terminated.

Methods for Nanowire Doping

Figure 5:
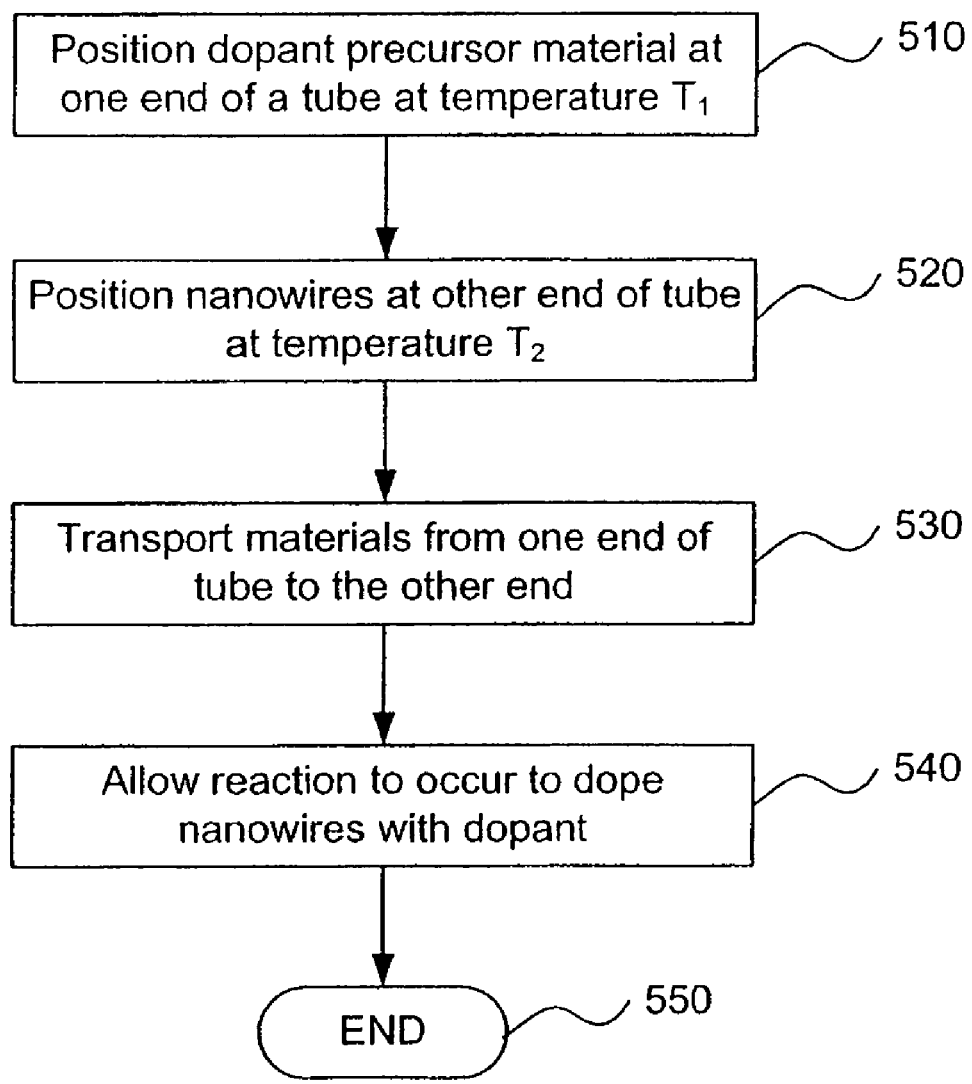
FIG. 5 is a flowchart of a method for doping nanowires, according to an embodiment of the invention.

FIG. 5 is a flowchart of method 500 for doping nanowires, according to an embodiment of the invention. Method 500 is similar to method 400, except that instead of synthesizing nanowires as was done in method 400 a similar approach to that of method 400 is used to dope nanowires. Method 500 begins in step 510. In step 510, a dopant precursor material is positioned at one end of a synthesis vessel, which is at temperature T1. Example dopant precursor materials can include, but are not limited to Mg, B, and $PO_4$.

In step 520, nanowires are positioned at the other end of a synthesis vessel, which is at temperature T2. Example nanowires can include, but are not limited to GaN nanowires and Si nanowires. In step 530, materials are transported from one end of the synthesis vessel to the other. In one embodiment, thermal vaporization is used to transport the dopant precursor materials to the other end of the vessel. In another embodiment, a chemical vapor transport agent can be used to transport the dopant precursor material. Chemical vapor transport agents can include, but are not limited to, chlorine and bromine. When phosphates are used as the precursor dopant material, the phosphate can also serve as the chemical vapor transport agent.

In step 540, the transfer agent is reacted with the granular precursor materials to form nanowires. In particular, the transfer agent reacts with granular precursor materials at T1 to form a volatile compound, which will diffuse to the surface of the nanowires and decompose to grow nanowires at T2. At the same time, the transport agent is regenerated and ready for another cycle to dope more nanowires. The growth cycle will continue until the process is terminated.

The above method can be summarized as a method for doping nanowires, including positioning a granular dopant precursor material at one end of a vessel at a first temperature; positioning nanowires at an opposite end of the vessel at a second temperature; transporting granular dopant precursor materials from one end of the vessel to the other end of the vessel; and reacting granular dopant precursor material with nanowires to form doped nanowires. Thermal vaporization can be used to transport the granular nanowire precursor material. A chemical vapor transport agent can be used to transport the granular nanowire precursor material. The chemical vapor transport agent can be one of chlorine, iodine and bromine. The granular dopant precursor material can be Mg and the nanowires can be GaN. The nanowires can be Si and the granular dopant precursor material can be B.

Methods to Improve Nanowire Quality

Figure 6:
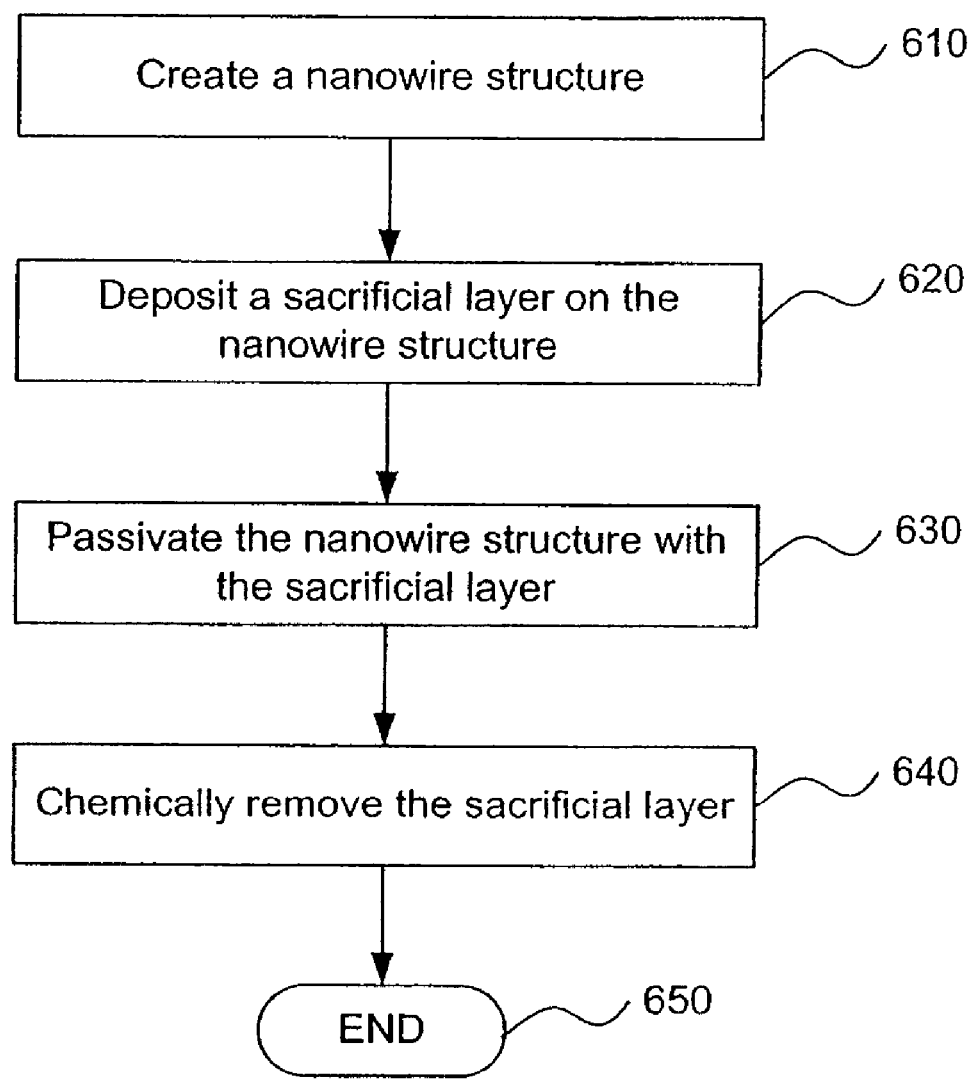
FIG. 6 is a flowchart of a method for reducing surface states from dangling bonds on a nanowire structure, according to an embodiment of the invention.

FIG. 6 is a flowchart of method 600 to reduce surface states from dangling bonds on a nanowire structure, according to an embodiment of the invention. In the growth of nanowires, such as Si nanowires, dangling Si bonds often form at the interface between an Si nanowire and a dielectric that inhibit nanowire performance. Hydrogen passivation is often used in Si nanowire processing to reduce surface states from dangling bonds to address this problem. However, the hydrogen plasma can induce surface damage during processing. Method 600 describes an approach to use a sacrificial layer to protect the nanowire, while passivation is used to reduce surface states of dangling bonds.

Figure 7:
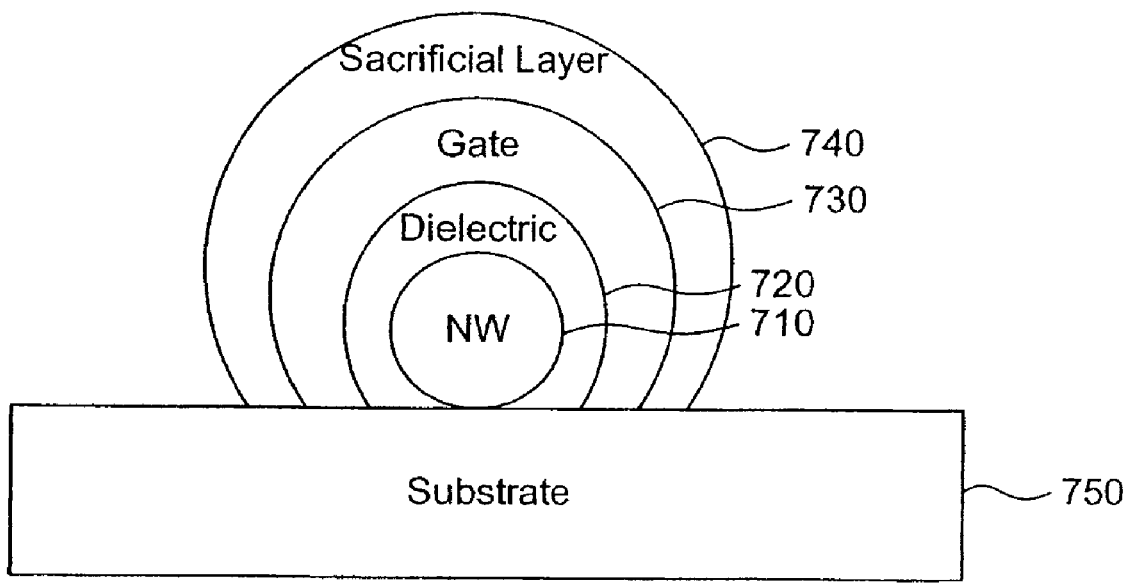
FIG. 7 is a diagram of a nanowire coated with a sacrificial layer, according to an embodiment of the invention.

Method 600 begins in step 610. In step 610 a nanowire structure is created. In step 620 a sacrificial layer is deposited on the nanowire structure. For example, FIG. 7 is a diagram of a nanowire structure coated with a sacrificial layer, according to an embodiment of the invention. The nanowire structure includes nanowire 710, dielectric 720, gate 730 and sacrificial layer 740. Dielectric 720 coats nanowire 710, while gate 730 coats dielectric 720. Sacrificial layer 740 coats gate 730. The entire nanowire structure is formed on substrate 750. In an alternative embodiment, the nanowire structure can include only a nanowire, such as nanowire 710, which is formed on substrate 750. Sacrificial layer 740 can include, but is not limited to $SiO_2$ or SiN. Dielectric 720 can include, but is not limited to $SiO_2$ or SiN. Gate 730 can include doped amorphous Si, but is not limited to doped amorphous Si. Moreover, substrate 750 can include Si, but is not limited to Si.

In step 630 the nanowire structure with the sacrificial layer, such as sacrificial layer 640, is passivated. In an embodiment, hydrogen passivation can be used. In step 640 the sacrificial layer is chemically removed. In an embodiment, selective etching with a wet etchant can be used to chemically remove the sacrificial layer, as would be known by individuals skilled in the relevant arts based on the teachings herein. The particular wet etchant to use would be selected based on the particular material contained within the sacrificial layer and the type of nanowire.

Methods for Modifying Nanowires Directly on a Substrate for Device Preparation

In another embodiment, the present invention provides processes by which nanowires can be modified directly on a substrate for device preparation. Preferably, the nanowires used in these processes will be substantially vertical nanowires. Vertical nanowires encompass nanowires that are substantially perpendicular to the surface of the substrate on which they are grown or deposited. Suitably, the vertical nanowires will be oriented such that they are between about 45° and about 90° with respect to the horizontal plane of the substrate, more suitably about 60° to about 90°, and most suitably about 80° to about 90° with respect to the horizontal plane of the substrate. Such nanowires can be produced using any suitable nanowire growth process known in the art, including those disclosed herein. While any substrate material disclosed herein can be used as a nanowire growth platform, suitably, the substrate material will be single-crystalline or polycrystalline, such that growth from the substrate will generate oriented, straight, single crystal dimension wires (suitably epitaxially oriented nanowires). In other embodiments, the nanowires can be horizontal, such as disclosed in U.S. Provisional Patent Application No. 60/632,337, filed Dec. 2, 2004, the disclosure of which is incorporated by reference herein in its entirety. In further embodiments, after processing of the nanowires on the growth substrate, the nanowires can be removed from the substrate by coating the nanowires with a polymer to form a composite, and then removing the nanowires from the substrate.

In one embodiment, the present invention provides processes for producing a nanowire device, comprising: providing a substrate having nanowires attached to a surface in a vertical orientation; depositing a dielectric layer on the surface of the nanowires; depositing one or more nanowire contacts on the nanowires; depositing a material over the nanowires to form a nanowire composite; and separating the nanowire composite from the substrate. The nanowire composite can then be transferred to a second substrate where the nanowires can be metallized.

Any on-substrate processing known or required by those skilled in the art can be performed on the substantially vertical nanowires. By providing nanowires that are separate, oriented and vertical, device processing of the wires is simplified and improved. In certain embodiments, a dielectric layer can be grown or deposited directly on the wires. The dielectric layer can be formed by oxidizing the nanowires, or otherwise forming the dielectric layer. Polymer dielectrics for use in the present invention include for example, polyimides, fluorinated polyimides, polybenzimidazoles and others. Dielectrics for use in the invention include $SiO_2$, $Ta_2O_5$, $TiO_2$, $ZrO_2$, $HfO_2$, $Al_2O_3$, and similar materials. Nitride dielectrics include AlN and SiN. As the wires are substantially separate, each wire can be fully coated with a dielectric material without the concern of sections of overlapping wire not receiving coating. In addition, further processing can include oxidation or nitridization of the nanowires. Nitridation of nanowires can be accomplished with processes similar to those employed in oxidation of nanowires. These materials can be applied to nanowires by chemical vapor deposition (CVD), solution phase over-coating, or by spin-coating the appropriate precursor onto the substrate. Other known techniques can be employed, for example sputtering and others.

In other embodiments, an implant, such as a gate electrode, can be added to the nanowires. Nanowire contacts, including sources, drains and gates, for example, can be patterned on the substrate using standard photolithography, ink-jet printing, or micro-contact printing processes, for example, or by other processes as described throughout.

Figure 8:
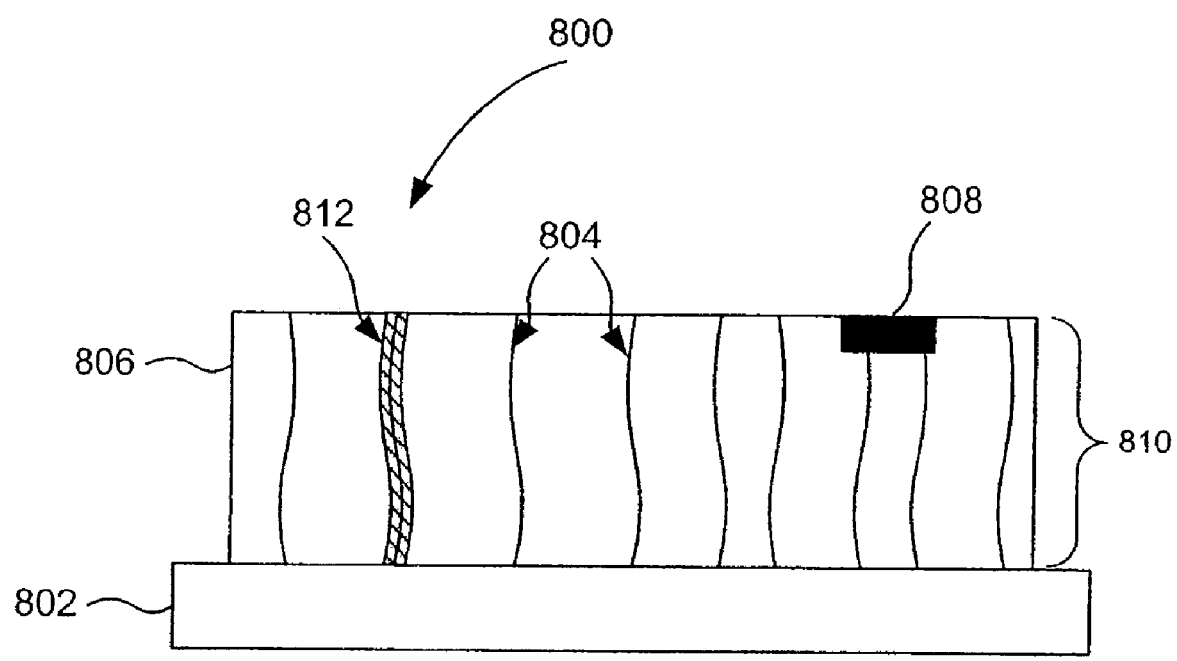
FIG. 8 is a diagram showing nanowire processing in accordance with one embodiment of the present invention.

FIG. 8 is a diagram showing nanowire processing in accordance with one embodiment of the present invention. As shown in FIG. 8, substantially vertical nanowires 804 can have dielectric layers 812 and/or metallic contacts 808, for example, deposited onto them. The nanowires can then be encapsulated in polymer 806, thereby producing a composite comprising polymer and nanowires. By covering all or a portion of the nanowires, composites comprising various densities of nanowires can be produced. Vertically grown nanowires will suitably be of the same overall length, owing to control of growth times and conditions. In addition, further alignment of the nanowires may not be necessary, as the vertical nanowires will already be substantially aligned and oriented when grown, especially when grown from a poly- or single-crystalline substrate 802. Creating a polymeric composite allows several nanowires to be removed together and subsequently transferred to a second, third, forth, etc. substrate material where metallic contacts can be added or additional processing can take place.

Suitable polymers for use in forming the nanowire composites include, but are not limited to, elastomers, thermoplastics and thermosetting resins. Useful polymers include oligomers, which includes, but is not limited to, monomers, dimers, trimers, tetramers, pentamers, hexamers, heptamers, octamers, nonamers, decamers, undecamers, and dodecamers; branched, hyperbranched, dendritic and other non-linear structural forms of polymers; prepolymers such as phenoxy and epoxy prepolymers; networked polymers such as interpenetrating and semi-interpenetrating network polymers; homopolymers, copolymers, terpolymers and other copolymers including random, statistical, alternating, block and graft copolymers and blends of two or more different polymers. Particular examples of polymers for use in nanowire composites include, but are not limited to, polyalkanes, polyhaloalkanes, polyalkenes, polyalkynes, polyketones, polycarbonates, polyamides, polyimides, polyarylenes, polyarylvinylenes, polyheteroarylenes, polyheteroarylvinylenes, polyesters, polyethers, polyurethanes, polybenzimidazoles, polysulfides, polysiloxanes, polysulfones, polysaccharides, polypeptides, polyphosphazenes, polyphosphates, phenolic and phenol-formaldehyde resins, epoxy and phenoxy resins, and urea- and melamine-formaldehyde resins. Such composites and methods for their preparation are disclosed in U.S. patent application Ser. No. 10/910,800, filed Aug. 4, 2004, which is incorporated herein by reference in its entirety.

In suitable embodiments, the polymer composite will comprise a mixture of at least two or more different polymers, and in certain embodiments a mixture of at least two epoxy polymers.

Removal of the polymer-nanowire composite 810 from substrate 802 can be achieved via any suitable method, including mechanical separation (e.g., cutting with a blade or tearing the nanowires from the substrate), chemical separation, including wet or dry etching, or chemical-mechanical polishing. Suitable etching agents include, but are not limited to KOH, $XeF_2$ and hydrofluoric acid and can be combined with an oxidizing agent such as $HNO_3$ or $H_2SO_4$. In other embodiments of the present invention, a removable layer can separate the nanowires from the substrate material. After generating the polymer-nanowire composite, the removable layer can be removed. For example, the removable layer can be dissolved by a solvent that will dissolve the removable layer, but not dissolve the polymer-nanowire composite or the substrate below the removable layer. In other embodiments, the removable layer can be a photoremovable layer, in which ultraviolet or other suitable wavelengths of light are used to remove the removable layer, thereby allowing separation of the polymer-nanowire composite from the substrate. One example of a photoremovable layer is a substance that breaks down and disintegrates in the presence of ultraviolet light. Suitably, the composite material used to encapsulate the nanowires will be hardened prior to removing the nanowires from the substrate.

Following removal of the polymer-nanowire composite, the composite can then be transferred to a second substrate where further processing can take place. For example, this second substrate can be selected so as to tolerate elevated temperatures, such that doping of the nanowires can take place. Methods by which to dope the nanowires are well known in the art and can be used to dope the nanowires and polymer-nanowire composites of the present invention.

Figure 9:
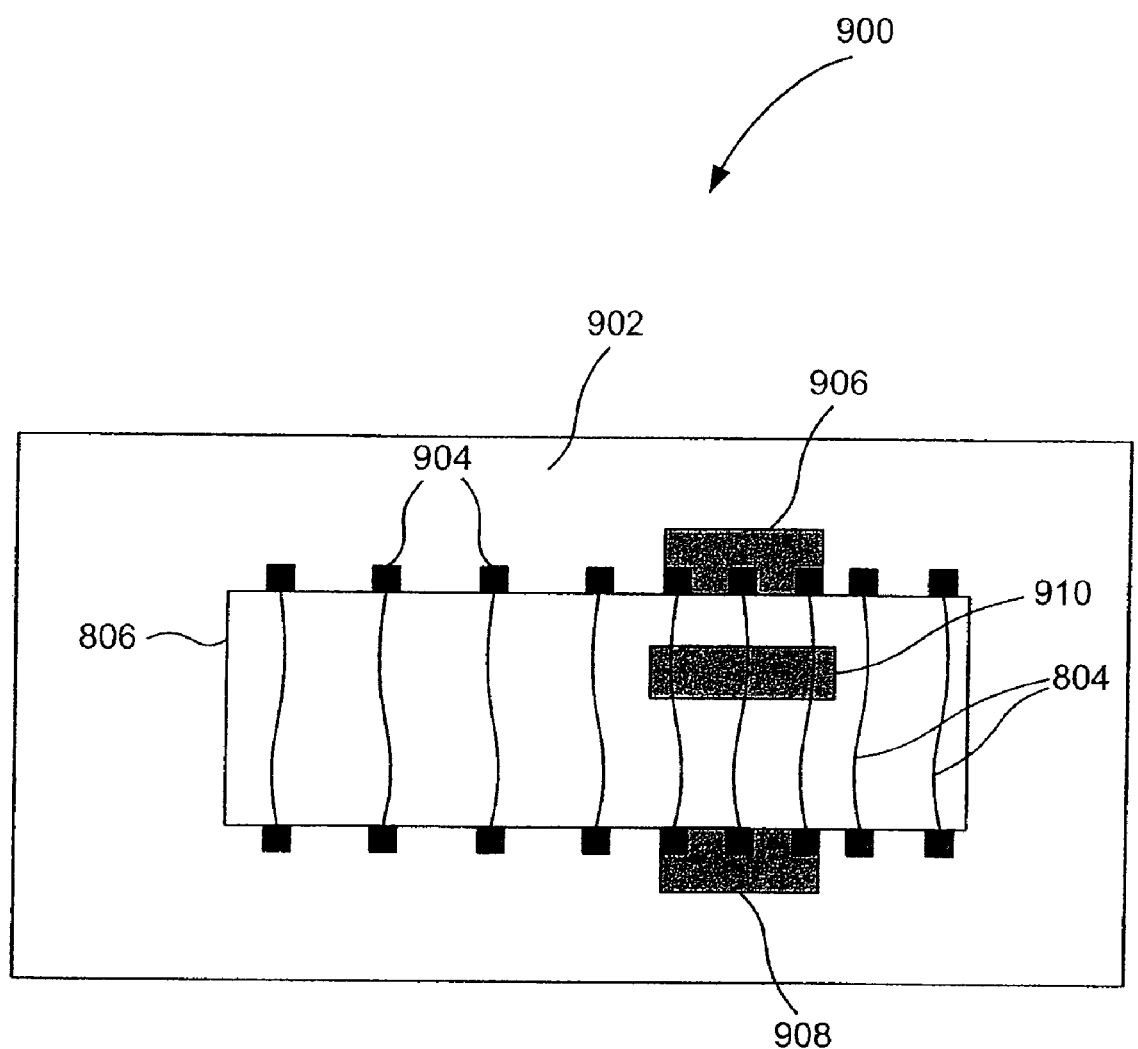
FIG. 9 is a diagram showing nanowire processing following transfer in accordance with one embodiment of the present invention.

FIG. 9 is a diagram showing nanowire processing following transfer in accordance with one embodiment of the present invention. As shown in FIG. 9, the polymer-nanowire composites 810 can subsequently be transferred to an additional substrate 902 where the nanowires can be metallized 904 to form electrical conductivity to device regions (e.g., gain, source, gait). In such embodiments, nanowires 804 can be coupled between a source electrode 906 and a drain electrode 908 over a portion of the gate electrode 910. In other embodiments, source and drain electrodes can be added and ohmic contacts can be generated on the wires. As the wires are further "anchored" by the metal contacts, gate isolation and metal processing steps as known in the art can be used to finalize the nanowire preparation. Such processing allows for wafers that can comprise multiple semiconductor devices on the same base substrate. In other embodiments, such processing can occur directly on the growth substrate 802, followed by removal of the nanowire composite, such that all, or substantially all, nanowire processing is prepared on the initial growth substrate 802.

Semiconductor devices prepared according to the present invention can have any number of contact areas formed to provide electrical connectivity. For example, anode and cathode electrodes can be formed with diodes or other two-terminal devices. Other semiconductor devices can have greater or fewer numbers of contact areas formed. Suitable methods of preparing semiconductor devices using the processes and nanowires of the present invention are disclosed in U.S. patent application Ser. No. 10/674,060, filed Sep. 30, 2003, which is incorporated herein by reference in its entirety.

A variety of contact area types can be formed according to the present invention. The contact areas can be Ohmic and non-Ohmic. For example, a non-Ohmic Schottky diode barrier contact can be used as an electrode. A Schottky diode barrier contact is commonly used for a III-V semiconductor material when it is difficult to make high quality gate dielectrics. Source electrodes, gate electrodes, and drain electrodes are formed of a conductive material, such as a metal, alloy, silicide, polysilicon, or the like, including combinations thereof, as would be apparent to a person having ordinary skill in the art. Note that the order in which the gates, sources, and drains are patterned can be varied. For example, gates, sources, and drains can be patterned simultaneously with each other or at different times.

Making reliable ohmic contacts with nanowires is difficult due to small contact areas and complicated interface states. Interfacial chemistry and physics between metal contacts and silicon are important technical areas regarding ohmic contacts. A key to success is the precise control of the metallization process and surface cleaning process prior to metallization. Suitable metallization schemes include Ti—Au, Ni and Al by electron beam (e-beam) evaporation. Various further processes, including ion gun cleaning, or HF etching can be employed to remove the surface dielectrics prior to metallization of source-drain electrodes.

In an embodiment of the invention a method for producing a nanowire device, includes providing a substrate having nanowires attached to a surface in a vertical orientation with respect to the substrate; depositing a dielectric layer on the surface of the nanowires; depositing one or more nanowire contacts on the nanowires; depositing a material over the nanowires to form a nanowire composite; and separating the nanowire composite from the substrate. This method can further include transferring the nanowire composite to a second substrate. This method can further include metallizing the nanowires. In this method the substrate can be crystalline or polycrystalline. In this method, the material can a polymer, which include an elastomer, thermoplastic or thermosetting resin. In this method the material can include a mixture of at least two or more different polymers. In this method the material can include a mixture of at least two epoxy polymers. In this method, the material can be hardened after depositing a material over the nanowires to form a nanowire composite and before separating the nanowire composite from the substrate. In this method separating the nanowire composite from the substrate includes using a blade or chemically etching the nanowire composite from the substrate.

Methods to Harvest Nanowires

Figure 10:
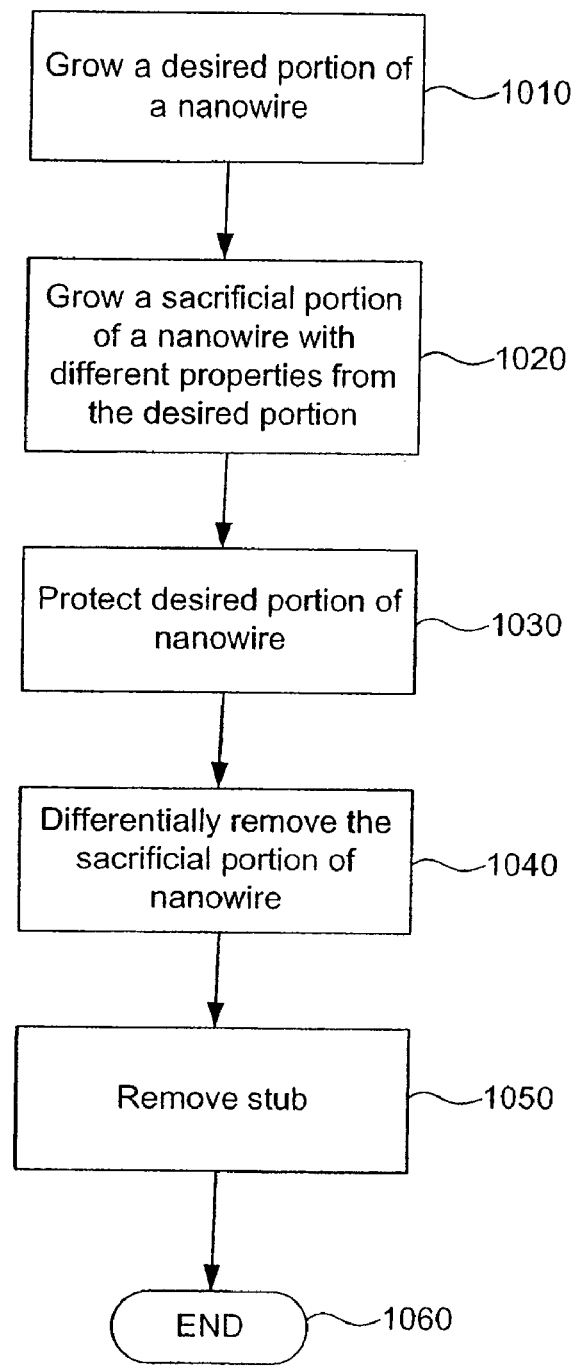
FIG. 10 is a flowchart of a method of harvesting a nanowire using a sacrificial portion, according to an embodiment of the invention.

FIG. 10 is a flowchart of method 1000 for harvesting a nanowire using a sacrificial portion, according to an embodiment of the invention. Nanowires are presently grown on substrates using an catalytic colloid to initiate nanowire growth. A difficulty limiting the ability to consistently grow and harvest high quality nanowires is the ability to remove the nanowires from the substrate without incurring physical damage to the wire, such as breakage. Current removal methods include using ultrasound and mechanical shearing. However, a problem with each of these is that they cause random breaks in the nanowires resulting in a non-uniform distribution of nanowire lengths.

Methods 1000, 1200, 1300, 1500 and 1600 provided below describe methods to address this problem. In particular, method 1000 involves the use of a sacrifical portion of a nanowire to provide more effective removal of the nanowires.

Figure 11:
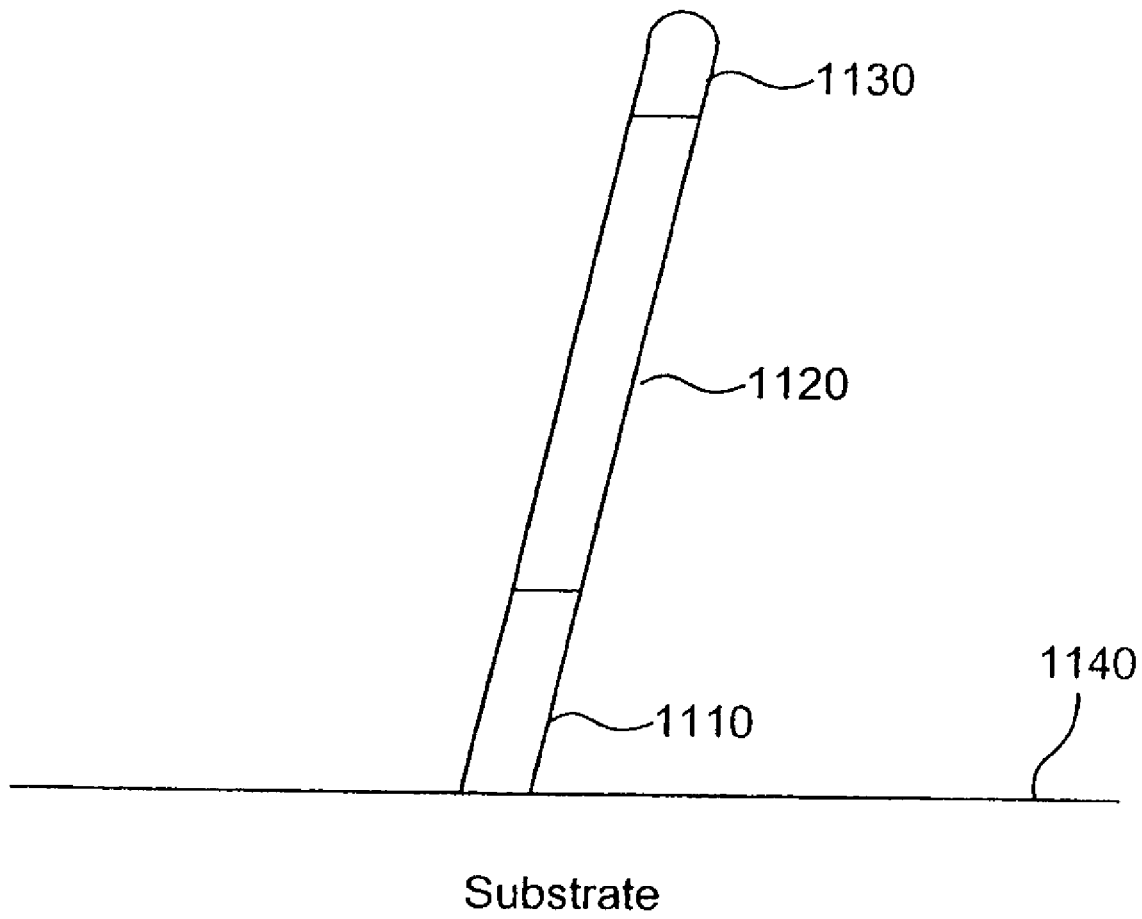
FIG. 11 is a diagram of a nanowire with a sacrificial portion, according to an embodiment of the invention.

Method 1000 begins in step 1010. In step 1010 a desired portion of a nanowire is grown. In one embodiment, an Au or Al colloid is used to grow the desired portion of the nanowire. In step 1020 a sacrificial portion of a nanowire is grown that has different properties from the desired portion. FIG. 11 illustrates a nanowire with a desired and sacrificial portion of a nanowire, according to an embodiment of the invention. In particular, FIG. 11 shows a nanowire including three parts— sacrificial portion 1110, desired portion 1120 and stub 1130, which is described below, that has been grown on substrate 1140.

In an embodiment, the properties that differ can be that different alloys are used for the sacrificial and desired portions of the nanowire. For example, the sacrificial portion can be SiGe and the desired portion can be Si.

In another embodiment, doping can be varied for the sacrificial and desired portion of the nanowire. For example, the sacrificial portion can be n-doped and the desired portion can be p-doped. Alternatively, the sacrificial portion can be p-doped and the desired portion can be n-doped. Similarly the sacrificial portion can have no doping, and the desired portion can be either p-doped on n-doped.

In an embodiment where different alloys are used for the desired and sacrificial portions of the nanowire, an Au alloy can be used to grow the sacrificial portion of the nanowire. The Au alloy can include, but is not limited to AuGe or AuSiGe, when Si nanowires are being grown and harvested. In an embodiment, the sacrificial portion of the nanowire can include SiGe and the desired portion can include Si. In this embodiment, Au would be used in step 1010 and AuGe would be used in step 1020 to stimulate nanowire growth, for example.

In an embodiment where the sacrificial portion of the nanowire is p-doped and the desired portion of the nanowire is n-doped, a boron NWS can be used as a dopant during the growth of the sacrificial portion of the nanowire.

In step 1030 the desired portion of the nanowire is protected. In one example, a photoresist can be applied to the desired portion of the nanowire to protect the nanowire. In an alternate embodiment the desired portion of the nanowire is not protected.

In step 1040 the sacrificial portion of the nanowire is differentially removed. The sacrificial portion of the nanowire can be differentially removed by using a wet etchant with a etching rate that is significantly higher for the materials within the sacrificial than for the materials within the desired portions of the nanowire. For example, hydrofluoric peroxide acetic acid ($1HF:2H_2O_2:3CH_3COOH$) can be used to remove a sacrificial portion that contains SiGe, when the desired portion is Si. When using this etchant, the etchant removes the SiGe alloy and stops efficiently at the Si surface of the desired portion. Other etchants can be used, as would be known by persons skilled in the relevant arts based on the teachings herein.

In an alternate embodiment, where the sacrificial portion of the nanowire is p-doped using a boron NWS as a dopant and the desired portion of the nanowire is n-doped example etchants can include, by are not limited to potassium hydroxide (KOH), tetramethylammonium hydroxide (TMAH) and ethylene diamine/pyrocatecol/water (EDP). These etchants etch the sacrificial portion of the nanowire at a rate ranging from 27:1 to greater than 500:1 compared to the etch rate of the desired portion, when Si nanowires are used, for example. The range depends on the specific etchant and the temperature, as would be known by individuals skilled in the art.

In step 1050 a stub at the tip of the nanowire is removed. Typically, this stub will be a residual and undesirable by-product of the catalyst used to initiate nanowire growth. Methods of removal will be known by individuals skilled in the relevant arts. In step 1060 method 1000 ends.

Figure 12:
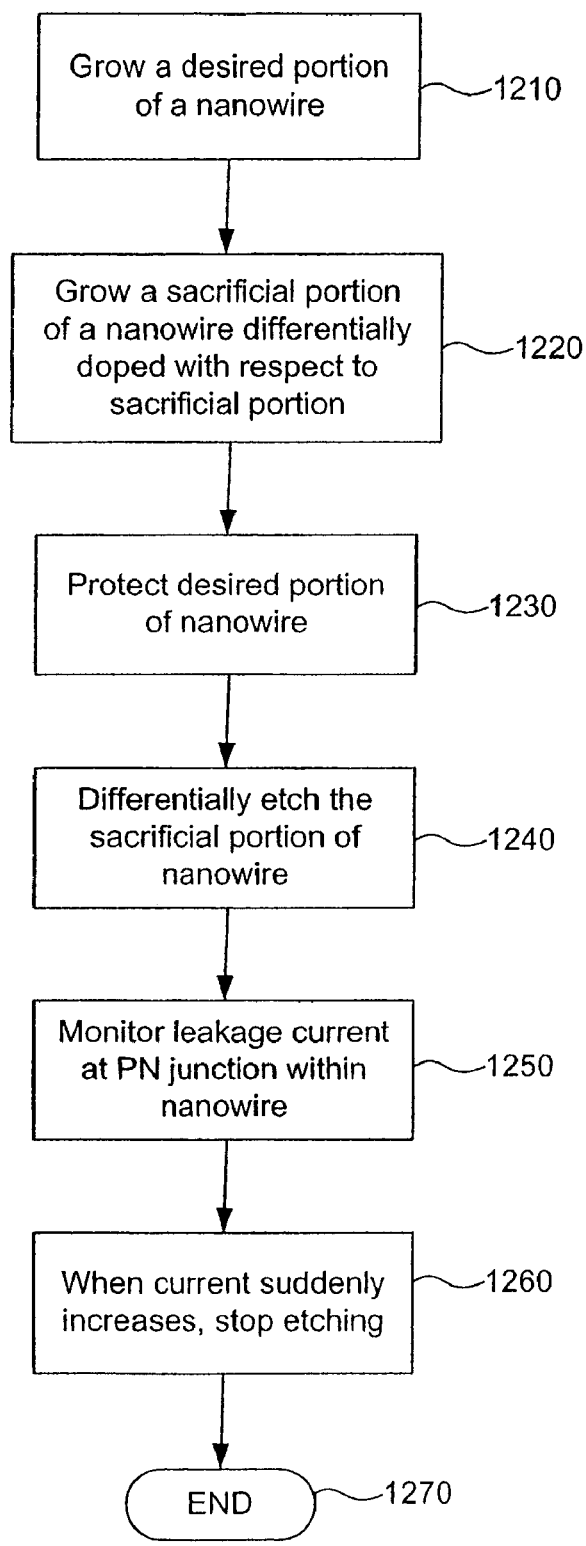
FIG. 12 is a flowchart of a method of harvesting a nanowire by monitoring of a PN junction, according to an embodiment of the invention.

FIG. 12 is a flowchart of method 1200 for harvesting a nanowire while monitoring of a PN junction, according to an embodiment of the invention. Method 1200 is similar to the embodiment involving different doping levels described with respect to method 1000. In method 1200, however, leakage current across a PN junction created between a sacrificial and desired portion of the nanowire is monitored to determine when the sacrificial portion has been successfully etched away.

Method 1200 begins in step 1210. In step 1210 a desired portion of a nanowire is grown. In step 1220 a sacrificial portion of the nanowire is grown. The desired portion is grown, such that the desired portion is differentially doped from the sacrificial portion. In step 1230 the desired portion of the nanowire is protected. In an embodiment, a photoresist can be applied to the desired portion of the nanowire. In step 1240 the sacrificial portion of the nanowire is differentially etched in a manner similar to that described with respect to step 1040 of method 1000. In step 1250 the leakage current between a PN junction between the desired portion and sacrificial portion of the nanowire is monitored. Steps 1240 and 1250 occur simultaneously. In step 1260 when the leakage current suddenly increases indicating that the sacrificial portion has been successfully etched away, etching is stopped. In step 1270 method 1200 ends.

Figure 13:
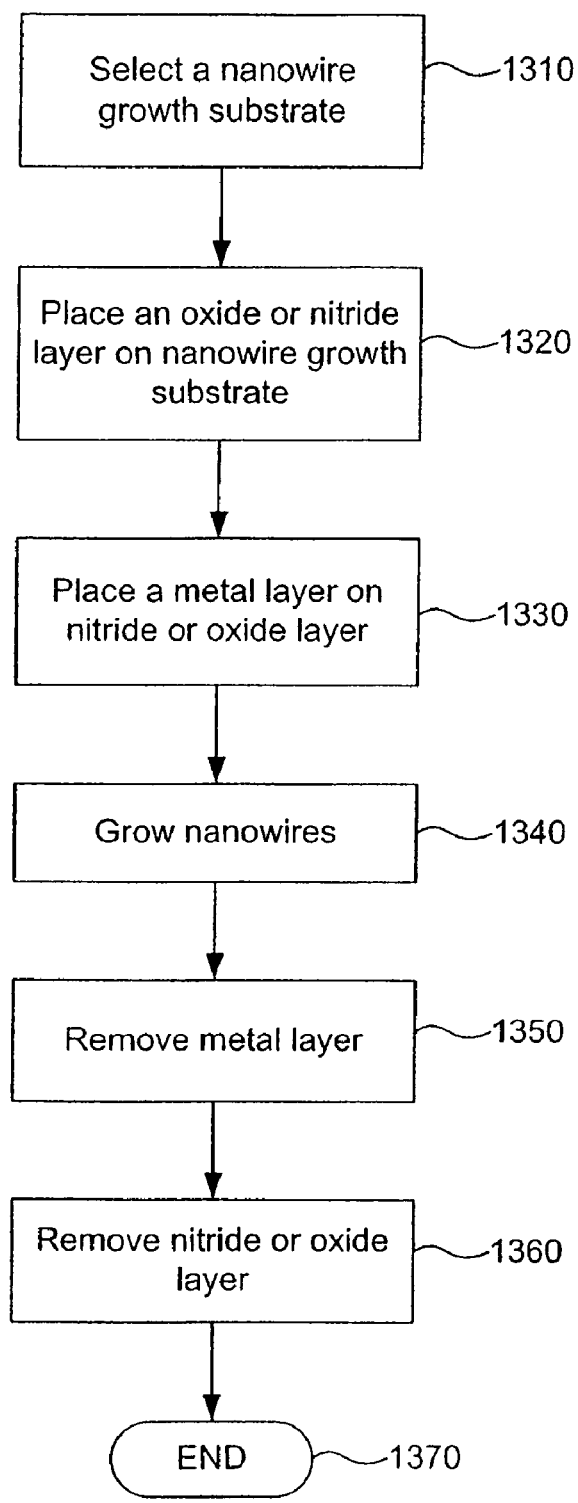
FIG. 13 is a flowchart of a method of harvesting a nanowire using a sacrificial metal layer on a nanowire growth substrate, according to an embodiment of the invention.
Figure 14:
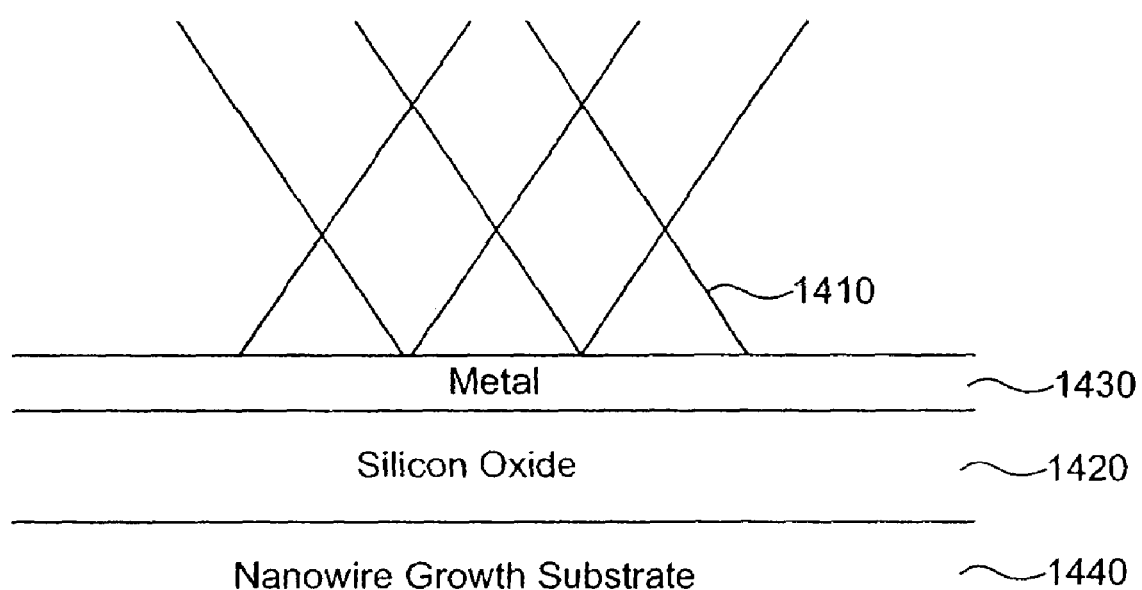
FIG. 14 is a diagram of a nanowire grown on a sacrificial metal layer on a nanowire growth substrate, according to an embodiment of the invention.

FIG. 13 is a flowchart of method 1300 for harvesting a nanowire using a sacrificial metal layer on a nanowire growth substrate, according to an embodiment of the invention. FIG. 14 illustrates, for example, the growth of nanowires, such as nanowire 1410, on sacrificial metal layer 1430. Sacrificial metal layer 1430 is layered on top of a silicon oxide layer 1420.

Method 1300 begins in step 1310. In step 1310 a nanowire growth substrate is selected. In step 1320 an oxide or nitride layer, such as silicon oxide layer 1320, is placed on the nanowire growth substrate. In step 1330 a metal layer, such as metal layer 1430, is placed on the nitride or oxide layer. The metal layer can include, but is not limited to Au, Al, Ti, or Cr.

In step 1340 nanowires are grown on the surface of the metal layer, as would be known by individuals skilled in the relevant arts based on the teachings herein. In step 1350 the metal layer is removed. In one embodiment, a metal etchant is used that removes the metal layer, but does not affect the nanowire. In step 1360 the nitride or oxide layer is removed. Similar to the case of the removing the metal layer, an etchant is used that removes the nitride or oxide layer without affecting the nanowire. By removing this layer the nanowires are released and can be harvested. In step 1370 method 1300 ends.

Figure 15:
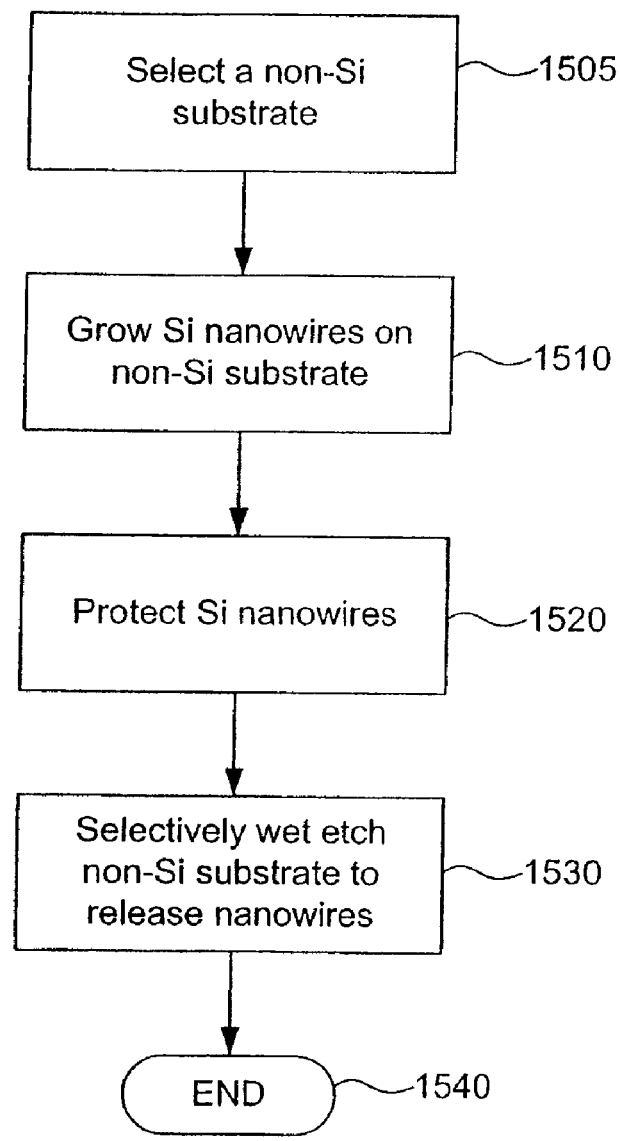
FIG. 15 is a flowchart of a method of harvesting an Si nanowire when using a non-Si substrate, according to an embodiment of the invention.

FIG. 15 is a flowchart of method 1500 for harvesting a Si nanowire when using a non-Si substrate to grow the Si nanowire, according to an embodiment of the invention. Method 1500 begins in step 1505. In step 1505 a non-Si substrate is selected. Example materials that can be used as the non-Si substrate include high temperature metals, Ge, and quartz. In step 1510 Si nanowires are grown on the non-Si substrate. In step 1520 the Si nanowire are protected. In an embodiment, the Si nanowires are coated with a photoresist. In alternative embodiments, the Si nanowires are not protected. In step 1530 the non-Si substrate is selectively wet etched to release the Si nanowires. In step 1540 method 1500 ends.

Figure 16:
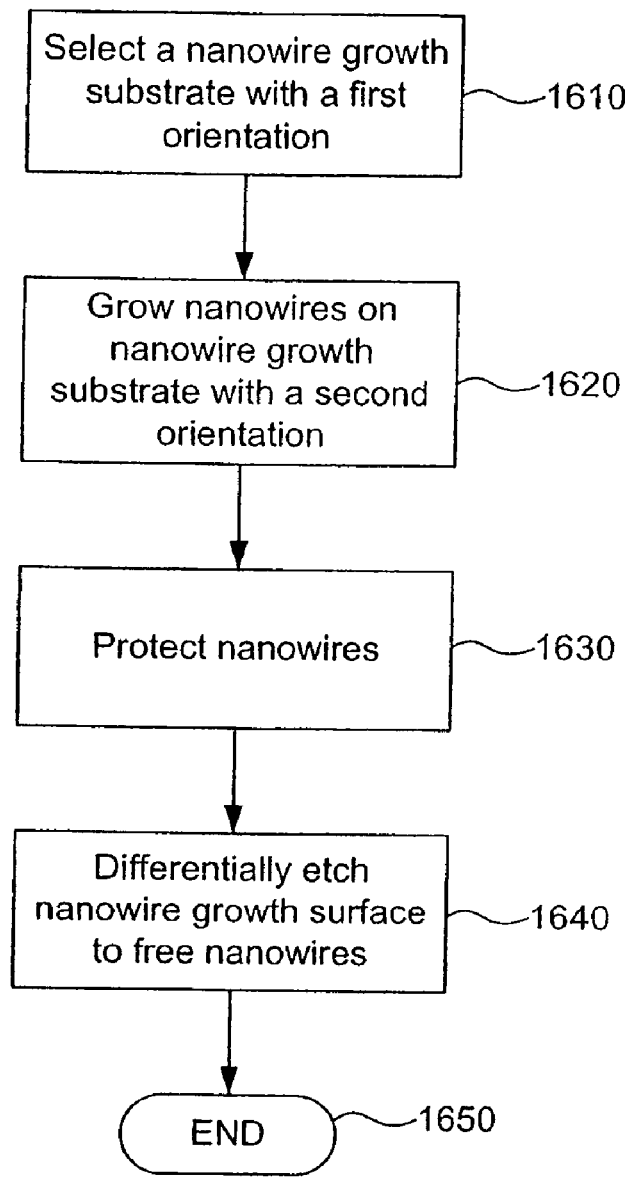
FIG. 16 is a flowchart of a method of harvesting a nanowire with one orientation when a nanowire growth substrate with a different orientation is used, according to an embodiment of the invention.
Figure 17:
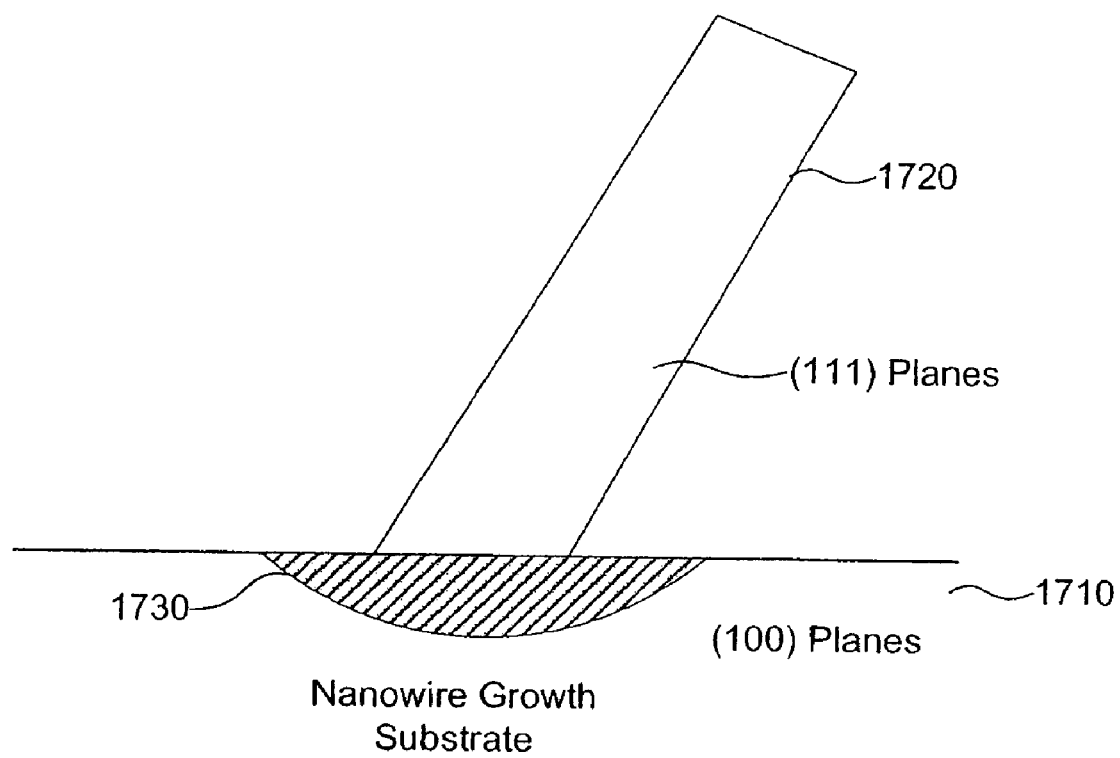
FIG. 17 is a diagram of a nanowire with one orientation growing on a nanowire growth substrate with a different orientation, according to an embodiment of the invention.

FIG. 16 is a flowchart of method 1600 for harvesting a nanowire with one orientation when a nanowire growth substrate with a different orientation is used, according to an embodiment of the invention. FIG. 17 provides a diagram of nanowire 1720 with one orientation growing on nanowire growth substrate 1710 with a different orientation, according to an embodiment of the invention. FIG. 17 shows portion 1730 of nanowire growth substrate 1710 that is etched away to free nanowire 1720. In an embodiment, nanowire 1720 can be Si, with atoms oriented such that the Miller indices are <111>. Nanowire growth substrate can also be Si with atoms oriented such that the Miller indices are <100>. In an alternative embodiment Si atoms can have Miller indices of <111> within nanowire 1710 and the Miller indices of Si atoms within the Si nanowire growth substrate can be <110>.

Method 1600 begins in step 1610. In step 1610 a nanowire growth substrate is selected that has a first orientation. For example, nanowire growth substrate 1710 with either a <100> or <110> orientation can be used. In step 1620 nanowires are grown on the nanowire growth substrate. The nanowires grown in step 1620 have a different orientation than the orientation of the nanowire growth substrate. For example, nanowire 1720 with a <111> orientation can be grown. In step 1630 the nanowires are protected. In an embodiment a photoresist can be applied to nanowires, such as nanowire 1720. In step 1640 the nanowire growth substrate is differentially etched to free the nanowires. For example, in an embodiment a wet etchant, including but not limited to KOH or TMAH can be used to differentially etch nanowire growth substrate 1610. In step 1650 method 1600 ends.

In another embodiment of the invention, a method of harvesting a nanowire includes growing a desired portion of the nanowire; growing a sacrificial portion of the nanowire with different properties from the desired portion of the nanowire; differentially removing the sacrificial portion of the nanowire; and removing a growth stub from the desired portion of the nanowire. This method can further include protecting the desired portion of the nanowire. In this method an Au alloy, such as, for example, AuGe or AuSiGe, can be used to grow the sacrificial portion of the nanowire. In this method the sacrificial portion of the nanowire can include SiGe and the desired portion can include Si. In this method differentially removing the sacrificial portion of the nanowire can further include using a wet etchant to selectively chemically etch to remove the sacrificial portion of the nanowire. In an embodiment, the wet etchant can be Hydrofluoric Peroxide Acetic Acid ($1HF:2H_2O_2:3CH_3OOH$).

In another embodiment of the invention, a method of harvesting a nanowire includes growing a sacrificial portion of the nanowire that is n- or p-doped; growing a desired portion of the nanowire that is not doped or oppositely doped from the sacrifcial portion of the nanowire, whereby a PN junction is created within the nanowire at a junction between the sacrificial portion of the nanowire and the desired portion of the nanowire; differentially etching the sacrificial portion of the nanowire; monitoring the leakage current at a PN junction between the sacrificial portion of the nanowire and the desired portion of the nanowire; and stopping etching when a sudden increase in leakage current across the PN junction occurs.

In an embodiment of the invention, a method for harvesting a nanowire, includes establishing a nanowire growth substrate; forming a nitride or oxide layer on the nanowire growth substrate; forming a metal layer on top of oxide or nitride layer; growing the nanowire; removing the metal layer; and removing the oxide or nitride layer to free the nanowire. In this method, the metal layer can be formed using Au, Al, Ti, or Cr. In this method a metal etchant is used that does not etch the nanowires. In this method when removing the oxide or nitride layer, an etchant is used that does not etch the nanowires.

In an embodiment of the invention, a method of harvesting a nanowire of a first material, includes establishing a substrate of a second material; forming the nanowire of the first material on the substrate of the second material; protecting the nanowire of the first material; and selectively wet etching the substrate of the second material to remove the nanowire of the first material. In this method the first material can be Si and the second material can be a high temperature metal. In this method the second material can be germanium. In this method the nanowire can be Si and a SiGe stub is formed at growth initiation to control a length of the nanowire after etching. In this method the second material can be quartz.

In an embodiment of the invention, a method of harvesting a nanowire with a first material with a first orientation, includes establishing a substrate of a second material with a second orientation; growing the nanowire of the first material with the first orientation on the substrate of a second material with the second orientation; protecting the nanowire of the first material with the first orientation; and selectively wet etching based on orientation the substrate of the second material with the second orientation to free the nanowire of the first material with the first orientation. In this method the first material can be Si and the second material can be Si and the first crystal orientation is <111> and the second orientation is <100>. In the method selectively wet etching the substrate of the second material with the second orientation includes using Potassium Hydroxide (KOH) or tetramethylammonium hydroxide (TMAH).

Figure 18:
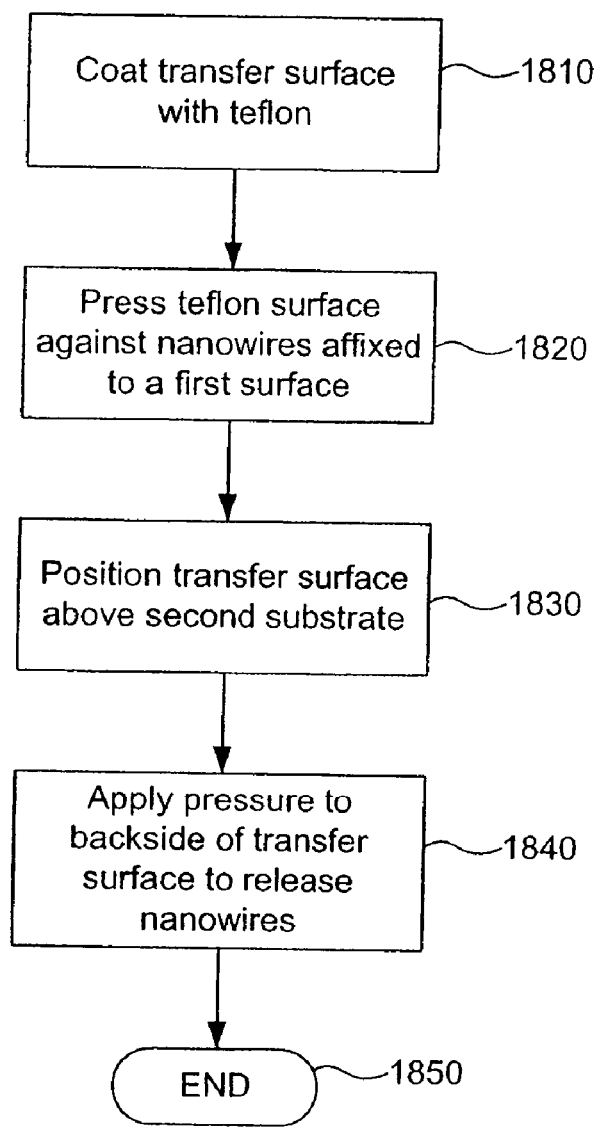
FIG. 18 is a flowchart of a method for transferring nanowires from a first substrate to a second substrate, according to an embodiment of the invention.
Figure 20B:
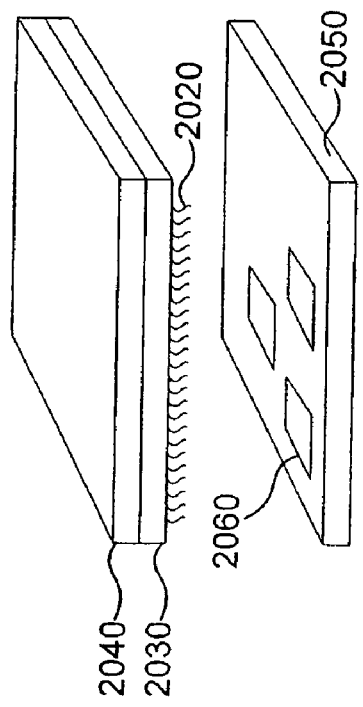
FIG. 20B is a diagram of a device substrate and a transfer substrate transferring nanowires, according to an embodiment of the invention.
Figure 20A:
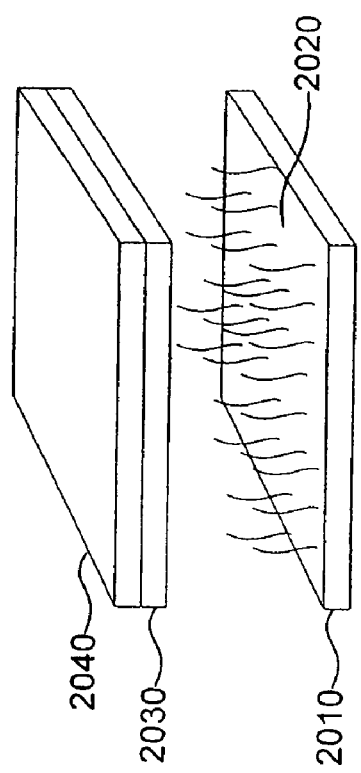
FIG. 20A is a diagram of a first substrate with nanowires and a transfer substrate, according to an embodiment of the invention.

Methods for Transferring Nanowires from a First Substrate to a Second Substrate Using a Teflon-Like Coated Surface FIG. 18 is a flowchart of method 1800 for transferring nanowires from a first substrate to a second substrate, according to an embodiment of the invention. FIGS. 20A and 20B will be referred to during the description of method 1800. FIG. 20A is a diagram of first substrate 2010 with nanowires 2020 and a transfer substrate 2040 with a non-stick coating 2030, according to an embodiment of the invention. FIG. 20B is a diagram of device substrate 2050 and transfer substrate 2040 with non-stick coating 2030 for transferring nanowires 2020, according to an embodiment of the invention. Device substrate 2050 contains nanowire placement areas, such as nanowire placement area 2060 where nanowires are to be located. In other embodiments, nanowires can be placed all over device substrate 2050.

Referring again to FIG. 18, method 1800 begins in step 1810. In step 1810 a transfer surface is coated with a non-stick coating, such as TEFLON. For example, transfer substrate 2040 can be coated with non-stick coating 2030. In other embodiments, TEFLON-like, which have non-stick surfaces can be used.

In step 1820 the transfer surface with the non-stick coating is pressed against nanowires that are affixed to a first substrate. Sufficient pressure is applied to affix the nanowires to the non-stick coating and remove them from the first substrate. For example, transfer substrate 2040 with non-stick coating 2030 can be pressed against nanowire growth substrate 2010 to remove nanowires 2020.

In step 1830 the transfer substrate is positioned above the second substrate. For example, referring to FIG. 20B, transfer substrate 2040 with non-stick coating 2030 containing nanowires 2020 is placed above device substrate 2050. In step 1840 pressure is applied to the backside of the transfer surface to release the nanowires. In one embodiment, pressure is applied uniformally on the backside of a transfer surface, such as transfer substrate 2040. In another embodiment, pressure can be applied in a patterned fashion to match the areas where nanowires are to be placed on a second substrate. For example, pressure can be applied to the backside of transfer substrate 2040 only above the nanowire placement areas 2060 to release nanowires that will then be positioned within those areas. In step 1850 method 1800 ends.

Figure 19:
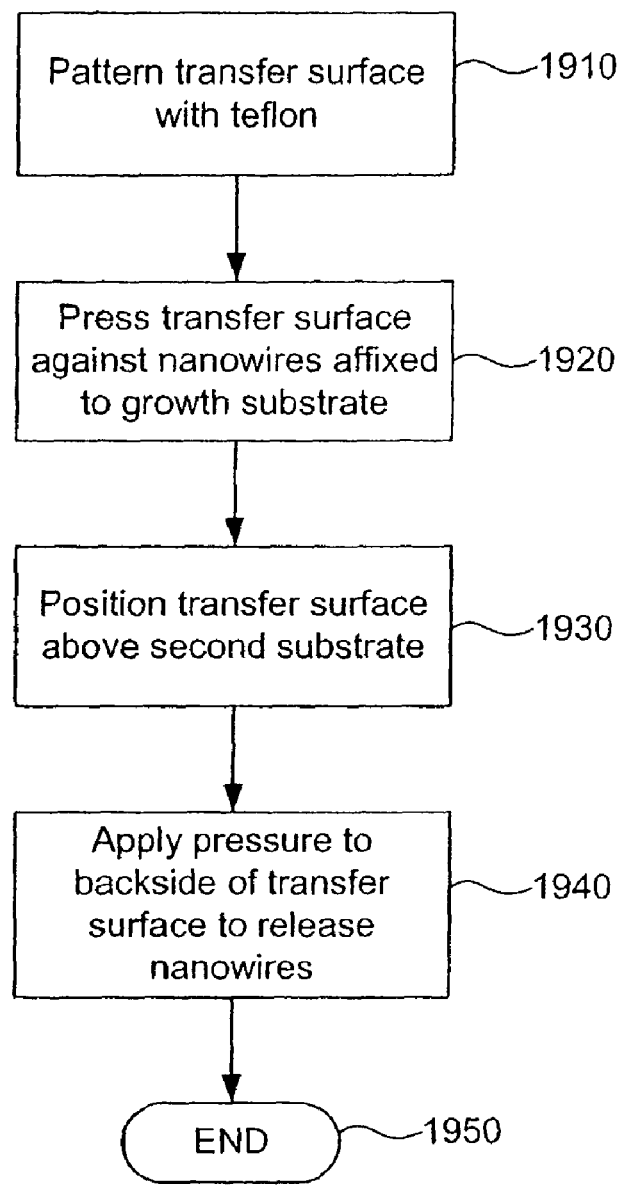
FIG. 19 is a flowchart of a method for transferring nanowires from a first substrate with a patterned coating to a second substrate, according to an embodiment of the invention.

FIG. 19 is a flowchart of method 1900 for transferring nanowires from a first substrate with a patterned coating to a second substrate, according to an embodiment of the invention. Method 1900 is similar to method 1800, except that the non-stick coating is only applied to certain areas on a transfer substrate that would correspond to nanowire placement areas on a second substrate where the nanowires are to be transferred.

Method 1900 begins in step 1910. In step 1910 a transfer surface is patterned with a non-stick coating, such as TEFLON or a TEFLON-like material. As stated above the patterned area can correspond to nanowire placement areas on the second substrate where the nanowires are to be deposited.

In step 1920 the transfer surface is pressed against nanowires affixed to a nanowire growth substrate. In step 1930 the transfer surface is positioned above a second substrate. In step 1940 pressure is applied uniformly to the backside of the transfer surface to release the nanowires. In an alternative embodiment, pressure can be applied only to the patterned areas of the transfer surface. In step 1950 method 1900 ends.

Methods for Transferring Nanowires from a First Substrate to a Second Substrate Using a Thermal Press Technique In another embodiment, the present invention provides methods for transferring nanowires from a growth substrate to a transfer substrate. For example, these embodiments are useful to transfer nanowires to transfer substrates that are suitably flexible, polymeric, materials. As noted throughout, it is a desire of nanowire processing to generate substantially oriented, separate nanowires that can then be further processed for use as electronic devices. In this embodiment, nanowires can be oriented individually during the transfer process, or the wires can be oriented prior to transfer, and then transferred as a whole to allow for easier device processing.

Figure 21:
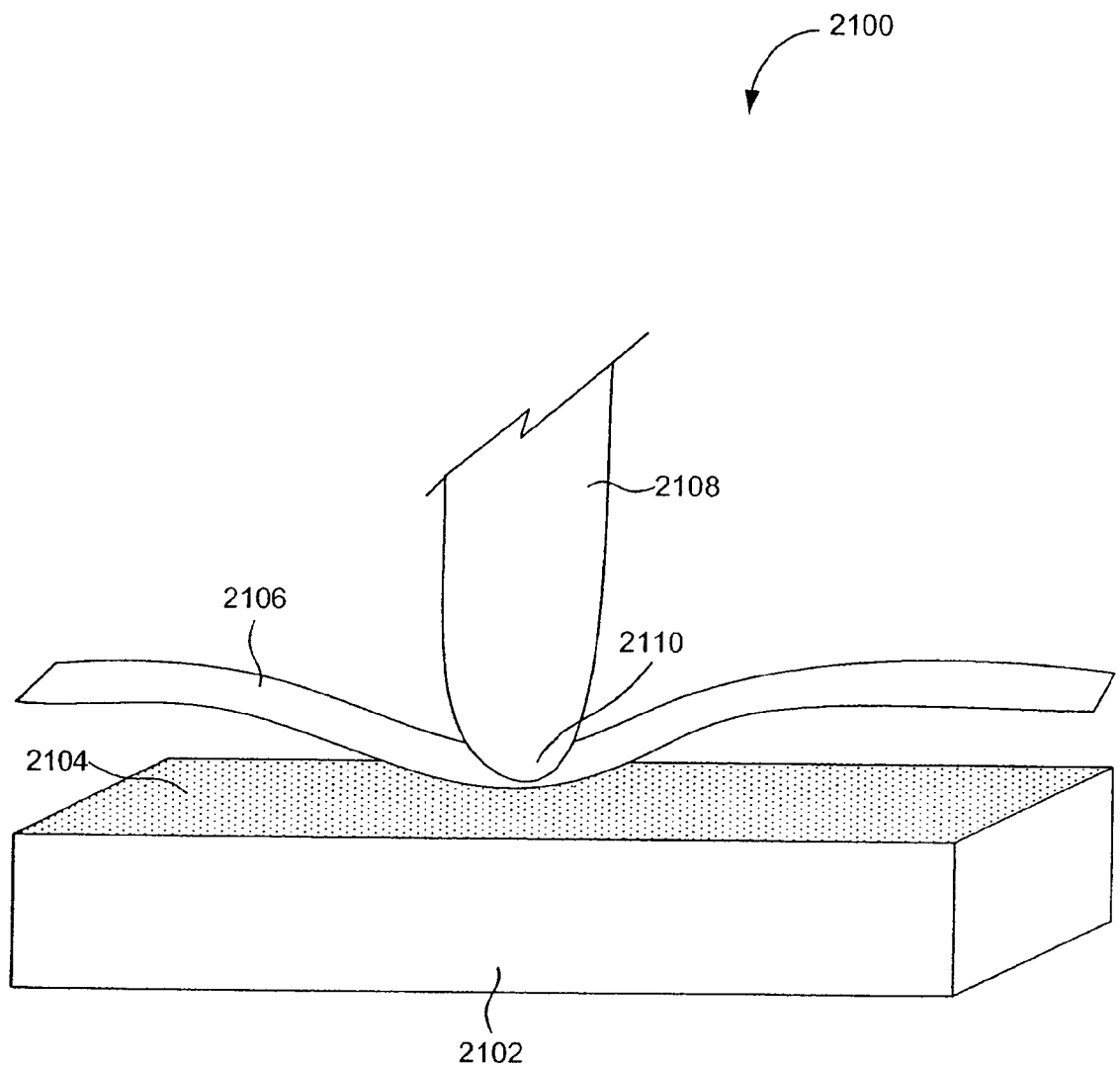
FIG. 21 is a representation of probe nanowire transfer scheme in accordance with one embodiment of the present invention.

FIG. 21 is a representation of probe nanowire transfer scheme in accordance with one embodiment of the present invention. In one embodiment, illustrated in FIG. 21, the present invention provides processes, for example as shown in transfer scheme 2100, for transferring nanowires from a growth substrate 2102 to a second substrate 2106 with the use of pressure applied via probe 2108. Nanowires can be grown using any suitable method known in the art, including those described herein. As shown in FIG. 21, nanowires 2104 are grown on substrate 2102. In addition to substrate 2102, the apparatus used for nanowire growth can further comprise removable layers or additional separation layers between substrate 2102 and nanowires 2104. Nanowires 2104 are transferred from the surface of substrate 2102 onto transfer substrate 2106 by applying pressure with probe 2108. Any transfer substrate can be used in the practice of the present invention. Suitably, transfer substrate 2106 will be a flexible polymeric sheet or polymeric film such as a film of polyethylene terephthalate (PET). Additional polymers that can be used as transfer substrate 2106 include, but are not limited to, thermoplastics, such as polyethylenes, polypropylenes, polystyrenes, polysulphones, polyamides, polycarbonates, thermosetting resins, elastomers and the like. The flexibility of transfer substrate 2106 can vary between a rather stiff, yet deformable material, and a highly malleable material. The amount of heat (see below) and pressure required to transfer nanowires to the transfer substrate depends upon the choice of transfer substrate. For example, if a malleable transfer substrate is selected, only a moderate amount of heat may be required to make the surface of the transfer substrate tacky. If however, a stiffer transfer substrate is selected, a higher amount of heat my be required to not only make the substrate surface tacky, but also to allow it to be malleable enough so that it can be deformed and make contact the substrate and nanowires in desired areas.

Probe 2108 will suitably be on the order of about millimeters to about centimeters in diameter at probe tip 2110, and generally will be in a conical or needle-like shape, though any suitable shape can be used. Probe 2108 and probe tip 2110 can be made from any suitable material that will withstand the applied pressure (and heat if required), including polymers, plastics and metals. In certain embodiments, the addition of pressure at probe tip 2110 is sufficient to transfer nanowires 2104 from substrate 2102 onto transfer substrate 2106. In other embodiments, an adhesive can be applied to the surface of transfer substrate 2106 so that nanowires 2104 will adhere to, and remain adhered to, transfer substrate 2106 following application of pressure by probe 2108. Suitable adhesives that can be used to coat the transfer substrates include, but are not limited to polyimides, epoxies, and other polymeric adhesives.

In additional embodiments, probe 2108 and probe tip 2110 can be heated so that the surface of transfer substrate 2106 will slightly melt, thereby becoming tacky or sticky, such as to act like an adhesive. In such embodiments, probe 2108 and probe tip 2110 are suitably made from metal that can withstand the applied heat. The temperature required to heat probe 2108 is dependent upon the temperature at which transfer substrate 2106 becomes tacky or sticky, but should not be so high that transfer substrate 2106 deforms excessively or flows under the applied pressure. Suitably, this temperature will be about 40° C. to about 100° C., depending upon the material selected as transfer substrate 2106. Suitably, when using PET as the transfer substrate, the temperature used will be about 60° C. The amount of pressure that is applied to probe 2108 and probe tip 2110 is largely dependent upon the flexibility and stability of transfer substrate 2106. The pressure should be such that the substrate is brought in contact with nanowires 2104 only in areas where nanowire transfer is desired. In suitable embodiments, the pressure applied to probe 2108 and probe tip 2110 will be on the order of about 10's of pounds per square inch (psi).

Application of pressure to nanowires 2104, in conjunction with a heated probe tip 2110 allows nanowires 2104 to transfer from substrate 2102 onto transfer substrate 2106 and remain there as the pressure and/or heat is reduced. Using the processes of the present invention, nanowires can be individually aligned on transfer substrate 2106 by selectively applying heat and/or pressure on top of a single wire, or a group of wires, such that these wires transfer to transfer substrate 2106, but additional wires, perhaps oriented in another direction, are not contacted and do not transfer. In embodiments where a heated probe is used, as the transfer substrate cools, the nanowires will remain attached to and/or embedded in the transfer substrate. In embodiments where an adhesive coats the surface of the transfer substrate, upon removal of the pressure applied by probe 2108, the nanowires will remain attached to the transfer substrate via the adhesion between the nanowires and the adhesive.

In other embodiments of the present invention, substrate 2102 can be heated, rather than, or in addition to, probe 2108 and probe tip 2110 being heating. In such embodiments, substrate 2102 can serve as the heat-generating portion of transfer scheme 2100, and pressure applied by probe 2108 allows for conductive heating of transfer substrate 2106 so that nanowires 2104 will transfer and remain attached to transfer substrate 2106.

The processes of the present invention can be used to transfer nanowires to select regions of transfer substrate 2106. Only regions where contact is made between transfer substrate 2106 and nanowires 2104, will the nanowires be transferred. Such embodiments of the present invention are referred to herein as a "tapping" method of nanowire transfer. In such embodiments, the probe tip can be moved around the transfer substrate, "tapping" the nanowires below to facilitate transfer from the substrate 2102 to the transfer substrate 2106. In other embodiments, the probe can be held stationary and the substrate and transfer substrate moved beneath it so as to control where nanowire transfer occurs, and the orientation of the nanowires on the transfer substrate. As discussed above, in such embodiments, either, or both, substrate 2102 and probe 2108/probe tip 2110 can be heated. Such embodiments of the present invention allow orientation of nanowires directly on transfer substrate 2106 by selectively transferring wires that have already been oriented on substrate 2102 using such methods as described herein (e.g., Langmuir Blodget, e-field, epitaxial growth, horizontal growth, etc.), or orienting the wires on the transfer substrate 2106 can also be achieved by transferring individual wires, or groupings of wires, and positioning (e.g., rotating) the transfer substrate 2106 such that the wires are oriented on the transfer substrate as they are transferred.

Figure 22:
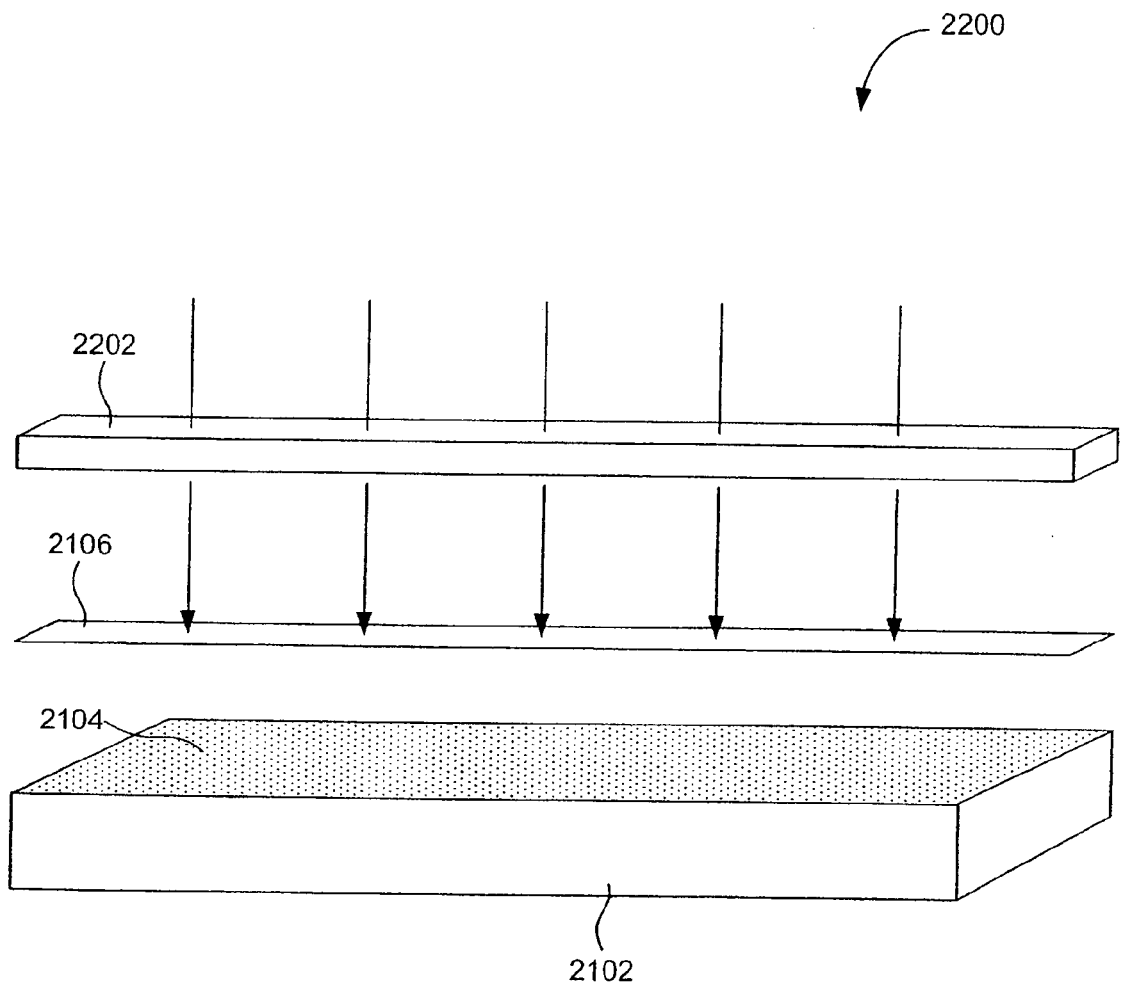
FIG. 22 is a representation of global nanowire transfer in accordance with one embodiment of the present invention.

FIG. 22 is a representation of global nanowire transfer in accordance with one embodiment of the present invention. In other embodiments of the present invention, as illustrated in FIG. 22, nanowire transfer from substrate 2102 to transfer substrate 2106 can be achieved by applying substantially uniform pressure over a larger area of the substrate, such as with a large area compressive device 2202, or a vacuum. As used herein, substantially uniform pressure indicates that the pressure applied to greater than about 50% of the total area of transfer substrate 2106 is the same. Suitably, about 90-100% of the total area of transfer substrate 2106 will have the same pressure applied across it. In certain such embodiments, the surface of transfer substrate 2106 can comprise an adhesive layer such that nanowires that come in contact with the adhesive layer will attach and remain attached. In other embodiments of the present invention, substrate 2102 can be heated, thereby conductively heating transfer substrate 2106, which aids in the transfer of nanowires 2104 to a now tacky or sticky transfer substrate 2106. In such embodiments, a global transfer of nanowires 2104 from substrate 2102 to transfer substrate 2106 occurs, and a substantial portion of the nanowires are transferred to the transfer substrate.

In embodiments of the present invention where a global transfer of wires is desired, pressure can be applied between substrate 2102 and transfer substrate 2106 by applying a vacuum. In such embodiments, a vacuum can be generated between transfer substrate 2106 and substrate 2102 such that there is a substantially uniform pressure over the entire transfer substrate 2106, allowing nanowire transfer at substantially all contact points between transfer substrate 2106 and nanowires 2104. Suitable vacuum pressures can be readily determined by those skilled in the art, and will generally be in the range of 10's of psi, suitably about 40 psi to about 100 psi.

In embodiments of the present invention where this global transfer technique is used, nanowires 2104 can first be pre-aligned on substrate 2102 prior to transfer to transfer substrate 2106. Any suitable nanowire alignment process can be used. In certain embodiments, the nanowires will be pre-aligned on substrate 2102 using electric field (e-field) alignment. FIGS. 23A-C illustrate transfer of e-field aligned wires. FIG. 23A illustrates an e-field alignment of nanowires prior to transfer. FIG. 23B illustrates nanowires 2104 remaining on substrate 2102 after global transfer. FIG. 23C illustrates nanowires transferred to transfer substrate 2106. One additional advantage of the global transfer technique, and the probe technique described above, is that substrate 2102 can be used repeatedly for nanowire growth and transfer after the nanowires that have grown on its surface have been transferred to a transfer substrate.

Transfer substrate 2106 utilized in any embodiments of the present invention can also have various device contacts deposited on its surface either prior to, or after nanowire transfer. For example, as described herein, source, drain and gait electrodes can be added to transfer substrate 2106, and then nanowires transferred to specific areas of transfer substrate 2106 either using the probe transfer process 2100 or global transfer process 2200 described herein. In embodiments where the global transfer processes is used, wires will suitably be aligned prior to transfer such that the device can be assembled directly on the transfer substrate.

Use of Nanowires of the Present Invention in Exemplary Devices and Applications

Numerous electronic devices and systems can incorporate semiconductor or other type devices with thin films of nanowires produced by the methods of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) can be coupled to signals of other electronic circuits, and/or can be integrated with other electronic circuits. Semiconductor devices can be formed on large substrates, which can be subsequently separated or diced into smaller substrates. Furthermore, on large substrates (i.e., substrates substantially larger than conventional semiconductor wafers), semiconductor devices formed thereon can be interconnected.

The nanowires produced by the processes of the present invention can also be incorporated in applications requiring a single semiconductor device, and to multiple semiconductor devices. For example, the nanowires produced by the processes of the present invention are particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The nanowires produced by the processes of the present invention are also applicable to smart libraries, credit cards, large area array sensors, and radio-frequency identification (RFID) tags, including smart cards, smart inventory tags, and the like.

The nanowires produced by the processes of the present invention are also applicable to digital and analog circuit applications. In particular, the nanowires produced by the processes of the present invention are useful in applications that require ultra large-scale integration on a large area substrate. For example, a thin film of nanowires produced by the processes of the present invention can be implemented in logic circuits, memory circuits, processors, amplifiers, and other digital and analog circuits.

The nanowires produced by the processes of the present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the nanowires produced by the processes of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are indicative of the level of skill of those skilled in the art to which this invention pertains, and are herein incorporated by reference to the same extent as if each individual publication, patent or patent application was specifically and individually indicated to be incorporated by reference.

What is claimed is:

1. A method for producing nanowires, comprising:
   (a) applying a catalyst-repelling material on a substrate material to at least partially cover the substrate material;
   (b) applying one or more nucleating particles on the substrate material;
   (c) heating the nucleating particles to a first temperature;
   (d) contacting the one or more nucleating particles with a first nanowire precursor gas mixture which reacts with the one or more nucleating particles to create one or more alloy droplets to initiate nanowire growth;
   (e) heating the one or more alloy droplets to a second temperature; and
   (f) contacting the one or more alloy droplets with a second nanowire precursor gas mixture,
   whereby one or more nanowires are grown at the site of the one or more alloy droplets.

2. The method of claim 1, wherein the applying in step (a) comprises layering catalyst-repelling material on a crystallographic substrate material.

3. The method of claim 2, wherein the applying in step (a) comprises layering catalyst-repelling material on silicon.

4. The method of claim 1, wherein the applying in step (a) comprises layering catalyst-repelling material that comprises at least one void that does not cover the substrate material.

5. The method of claim 4, wherein the applying in step (b) comprises depositing nucleating particles on the catalyst-repelling material, wherein the nucleating particles deposit on the substrate material at the site of the at least one void.

6. The method of claim 1, wherein the applying in step (a) comprises layering catalyst-repelling material which comprises $SiO_2$, or anodic alumina.

7. The method of claim 2, wherein the growing occurs epitaxially.

8. The method of claim 1, wherein the growing is out of a plane of the substrate material.

9. The method of claim 1, wherein the first temperature is higher than the second temperature.

10. The method of claim 9, wherein the first temperature is at least 50° C. above the second temperature.

11. The method of claim 1, wherein the applying in step (b) comprises depositing one or more nucleating particles that comprise a metal that reacts with both the first nanowire precursor gas mixture and the second nanowire precursor gas mixture to form a eutectic from which Si precipitates.

12. The method of claim 11, wherein the applying in step (b) comprises depositing nucleating particles which comprise Au, Al, Pt, Fe, Ti, Ga, Ni, Sn or In.

13. The method of claim 1, wherein the applying in step (b) comprises depositing a metallic colloid.

14. The method of claim 13, wherein the applying in step (b) comprises depositing a Au or Al colloid.

15. The method of claim 1, wherein the applying in step (b) comprises depositing a metallic film.

16. The method of claim 15, wherein the applying in step (b) comprises depositing a Au or Al film.

17. The method of claim 1, wherein the contacting with a first nanowire precursor gas mixture in step (d) comprises contacting with a gas mixture comprising $SiH_4$, $SiCl_4$ or $SiH_2Cl_2$.

18. The method of claim 1, wherein the contacting with a second nanowire precursor gas mixture in step (f) comprises contacting with a gas mixture comprising $SiH_4$, $Si_2H_6$, $SiCl_4$ or $SiH_2Cl_2$.

19. The method of claim 1, wherein the contacting in (d) or (f) comprises performing plasma enhanced sputter deposition.

20. The method of claim 1, further comprising:
(g) heating the alloy droplet to a third temperature; and
(h) contacting the growing nanowires with one or more third nanowire precursor gas mixtures comprising $SiH_4$, $Si_2H_6$, $SiCl_4$ or $SiH_2Cl_2$ to grow the nanowires to a desired length.

21. The method of claim 20, wherein the contacting in (h) comprises performing plasma enhanced sputter deposition.

22. A method for producing nanowires, comprising:
(a) applying a catalyst-repelling material on a silicon substrate to at least partially cover the silicon substrate, wherein the catalyst-repelling material comprises at least one void that does not cover the silicon substrate;
(b) applying one or more metallic nucleating particles on the catalyst-repelling material, wherein at least a portion of the one or more metallic nucleating particles deposit on the silicon substrate at the site of the at least one void;
(c) heating the one or more metallic nucleating particles to a first temperature;
(d) contacting the metallic nucleating particles with a first nanowire precursor gas mixture, whereby the first nanowire precursor gas mixture reacts with the one or more metallic nucleating particles to create one or more alloy droplets to initiate nanowire growth;
(e) heating the one or more alloy droplets to a second temperature; and
(f) contacting the one or more alloy droplets with a second nanowire precursor gas mixture,
whereby one or more nanowires are grown at the site of the one or more alloy droplets.

23. The method of claim 22, wherein the applying in step (a) comprises layering a catalyst-repelling material which comprises $SiO_2$, or anodic alumina.

24. The method of claim 22, wherein the growing occurs epitaxially.

25. The method of claim 22, wherein the growing is out of a plane of the silicon substrate.

26. The method of claim 22, wherein the first temperature is higher than the second temperature.

27. The method of claim 26, wherein the first temperature is at least 50° C. above the second temperature.

28. The method of claim 22, wherein the applying in step (b) comprises depositing Au, Al, Pt, Fe, Ti, Ga, Ni, Sn or In.

29. The method of claim 22, wherein the applying in step (b) comprises depositing a metallic colloid.

30. The method of claim 29, wherein the applying in step (b) comprises depositing a Au or Al colloid.

31. The method of claim 22, wherein the applying in step (b) comprises depositing a metallic film.

32. The method of claim 31, wherein the applying in step (b) comprises depositing a Au or Al film.

33. The method of claim 22, wherein the contacting with a first nanowire precursor gas mixture in step (d) comprises contacting with $SiH_4$, $SiCl_4$ or $SiH_2Cl_2$.

34. The method of claim 22, wherein the contacting with a second nanowire precursor gas mixture in step (f) comprises contacting with a gas mixture comprising $SiH_4$, $Si_2H_6$, $SiCl_4$ or $SiH_2Cl_2$.

35. The method of claim 22, wherein the contacting in (d) or (f) comprises performing plasma enhanced sputter deposition.

36. The method of claim 22, further comprising:
(g) heating the one or more alloy droplets to a third temperature; and
(h) contacting the one or more growing nanowires during nanowire growth with one or more third nanowire precursor gas mixtures comprising $SiH_4$, $Si_2H_6$, $SiCl_4$ or $SiH_2Cl_2$, and further comprising $B_2H_6$, $POCl_3$ or $PH_3$, to grow the one or more nanowires to a desired length.

37. The method of claim 36, wherein the contacting in (h) comprises performing plasma enhanced sputter deposition.

* * * * *